United States Patent
Kim et al.

(10) Patent No.: US 12,545,667 B2
(45) Date of Patent: Feb. 10, 2026

(54) COMPOUND FOR ORGANIC ELECTRONIC ELEMENT, ORGANIC ELECTRONIC ELEMENT USING THE SAME, AND AN ELECTRONIC DEVICE THEREOF

(71) Applicant: DUK SAN NEOLUX CO., LTD., Cheonan-si (KR)

(72) Inventors: Hye jeong Kim, Cheonan-si (KR); Hyung Dong Lee, Cheonan-si (KR); Hyeng Gun Song, Cheonan-si (KR); Sun Hee Lee, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 41 days.

(21) Appl. No.: 18/339,655

(22) Filed: Jun. 22, 2023

(65) Prior Publication Data

US 2023/0339923 A1    Oct. 26, 2023

Related U.S. Application Data

(63) Continuation-in-part of application No. 17/756,193, filed as application No. PCT/KR2020/016272 on Nov. 18, 2020, now Pat. No. 12,274,163.

(30) Foreign Application Priority Data

Nov. 19, 2019    (KR) .................. 10-2019-0148780
Aug. 14, 2020    (KR) .................. 10-2020-0102536

(51) Int. Cl.
*C07D 407/14*    (2006.01)
*C07D 409/14*    (2006.01)
(Continued)

(52) U.S. Cl.
CPC ......... *C07D 409/14* (2013.01); *C07D 407/14* (2013.01); *C09K 11/06* (2013.01);
(Continued)

(58) Field of Classification Search
CPC ............... H10K 85/631; H10K 85/636; H10K 85/6574; H10K 85/6576; C09K 2211/145; C09K 2211/1458
See application file for complete search history.

(56) References Cited

U.S. PATENT DOCUMENTS

2005/0236970 A1*  10/2005  Matsudate ........... H10K 59/122
                                                        313/500
2010/0288362 A1*  11/2010  Hatwar ................ H10K 50/131
                                                        257/E51.026
(Continued)

FOREIGN PATENT DOCUMENTS

CN    105778891 A    7/2016
CN    105906640 A    8/2016
(Continued)

OTHER PUBLICATIONS

KR-2017138799-A—translation (Year: 2017).*
(Continued)

*Primary Examiner* — Jennifer A Boyd
*Assistant Examiner* — Rachel Simbana
(74) *Attorney, Agent, or Firm* — Vorys, Sater, Seymour and Pease LLP; Mih Suhn Koh

(57) ABSTRACT

Provided are a compound capable of improving the light-emitting efficiency, stability, and lifespan of an element; an organic electronic element using the same; and an electronic device thereof.

9 Claims, 2 Drawing Sheets

(51) Int. Cl.
*C09K 11/06* (2006.01)
*H10K 50/11* (2023.01)
*H10K 50/15* (2023.01)
*H10K 50/16* (2023.01)
*H10K 50/81* (2023.01)
*H10K 85/60* (2023.01)

(52) U.S. Cl.
CPC ............. *H10K 50/11* (2023.02); *H10K 50/15* (2023.02); *H10K 50/16* (2023.02); *H10K 50/81* (2023.02); *H10K 85/6574* (2023.02); *H10K 85/6576* (2023.02); *C09K 2211/145* (2013.01); *C09K 2211/1458* (2013.01)

(56) References Cited

U.S. PATENT DOCUMENTS

| | | | |
|---|---|---|---|
| 2015/0155524 A1* | 6/2015 | Liu | H10K 50/85 257/40 |
| 2015/0295181 A1* | 10/2015 | Mujica-Fernaud | H05B 33/20 252/500 |
| 2015/0364694 A1* | 12/2015 | Lee | C07D 277/66 546/113 |
| 2017/0084843 A1 | 3/2017 | Yun et al. | |
| 2017/0365794 A1 | 12/2017 | Park et al. | |
| 2018/0026187 A1 | 1/2018 | Park et al. | |
| 2019/0088879 A1 | 3/2019 | Haketa et al. | |
| 2019/0165285 A1* | 5/2019 | Uno | C07F 7/0812 |
| 2019/0363263 A1 | 11/2019 | Uno | |

FOREIGN PATENT DOCUMENTS

| | | | | |
|---|---|---|---|---|
| CN | 109867652 A | 6/2019 | | |
| CN | 114641870 A | 6/2022 | | |
| EP | 3 348 552 A1 | 7/2018 | | |
| EP | 3 764 416 A1 | 1/2021 | | |
| KR | 10-2013-0076842 A | 7/2013 | | |
| KR | 10-2015-0083917 A | 7/2015 | | |
| KR | 10-2017-0138799 A | 12/2017 | | |
| KR | 2017138799 A | * 12/2017 | ........... | C07D 209/96 |
| KR | 10-2018-0112962 A | 10/2018 | | |
| KR | 10-2019-0015211 A | 2/2019 | | |
| KR | 10-2019-0058640 A | 5/2019 | | |
| KR | 10-2019-0061314 A | 6/2019 | | |
| KR | 10-2019-0140659 A | 12/2019 | | |
| WO | 2018/069167 A1 | 4/2018 | | |
| WO | 2020/159019 A1 | 8/2020 | | |

OTHER PUBLICATIONS

European Search Report for corresponding EP 20890898.8, mailed Oct. 27, 2022, 4 pages.
First Office Action for corresponding EP 20890898.8, mailed Nov. 9, 2022, 15 pages.
Second Office Action for corresponding EP 20890898.8, mailed Sep. 22, 2023, 5 pages.
Matsumoto et al., "27.5L: Late-News Paper: Multiphoton Organic EL device having Charge Generation Layer", SID 03 Digest, 2003, pp. 979-981.

* cited by examiner

COMPOUND FOR ORGANIC ELECTRONIC ELEMENT, ORGANIC ELECTRONIC ELEMENT USING THE SAME, AND AN ELECTRONIC DEVICE THEREOF

CROSS-REFERENCE OF RELATED APPLICATIONS

This application is a continuation-in-part of U.S. patent application Ser. No. 17/756,193 filed on May 19, 2022, which was a 371 of PCT/KR2020/016272 filed on Nov. 18, 2020, which claims the benefit of priority from Korean Patent Application No. 10-2020-0102536 filed on Aug. 14, 2020 and Korean Patent Application No. 10-2019-0148780 filed on Nov. 19, 2019, the contents of each of which are incorporated herein by reference in its entirety.

BACKGROUND

Technical Field

The present invention relates to a compound for an organic electronic element, an organic electronic element using the same, and an electronic device thereof.

Background Art

In general, organic light emitting phenomenon refers to a phenomenon that converts electric energy into light energy by using an organic material. An organic electronic element using an organic light emitting phenomenon usually has a structure including an anode, a cathode, and an organic material layer interposed therebetween. Here, in order to increase the efficiency and stability of the organic electronic element, the organic material layer is often composed of a multi-layered structure composed of different materials, and for example, may include a hole injection layer, a hole transport layer, an emitting layer, an electron transport layer, an electron injection layer and the like.

A material used as an organic material layer in an organic electronic element may be classified into a light emitting material and a charge transport material, such as a hole injection material, a hole transport material, an electron transport material, an electron injection material and the like depending on its function.

Lifespan and efficiency are the most problematic issues in organic light emitting diodes, and as displays become larger, these efficiency and lifespan problems must be solved. Efficiency, lifespan, and driving voltage are related to each other, and when the efficiency is increased, the driving voltage is relatively decreased, and as the driving voltage is decreased, crystallization of organic materials due to Joule heating generated during driving decreases, and consequently the lifespan tends to increase.

However, the efficiency cannot be maximized simply by improving the organic material layer. This is because, when the energy level and T1 value between each organic material layer, and the intrinsic properties (mobility, interfacial properties, etc.) of materials are optimally combined, long lifespan and high efficiency can be achieved at the same time.

Further, recently, in organic electroluminescent devices, in order to solve the emission problem in the hole transport layer, an emitting-auxiliary layer must be present between the hole transport layer and an emitting layer, and it is necessary to develop different emitting-auxiliary layers according to each of the emitting layers (R, G, B).

In general, electrons are transferred from the electron transport layer to the emitting layer, and holes are transferred from the hole transport layer to the emitting layer to generate excitons by recombination.

However, the material used for the hole transport layer has a low HOMO value and therefore has mostly low T1 value, therefore the exciton generated in the emitting layer is transferred to the hole transport layer, resulting in charge unbalance in the emitting layer, and light is emitted at the interface of the hole transport layer.

When light is emitted at the interface of the hole transport layer, the color purity and efficiency of the organic electronic element are lowered and the life span is shortened. Therefore, it is urgently required to develop an emitting-auxiliary layer having a high T1 value and a HOMO level between the HOMO energy level of the hole transport layer and the HOMO energy level of the emitting layer.

Meanwhile, it is necessary to develop a hole injection layer material having stable characteristics, that is, a high glass transition temperature, against Joule heating generated when the device is driven, while delaying penetration of the metal oxide from the anode electrode (ITO), which is one of the causes of shortening the lifespan of the organic electronic element, into the organic layer. The low glass transition temperature of the hole transport layer material has a characteristic that when the device is driven, the uniformity of the surface of the thin film is lowered, which has been reported to have a great influence on the lifespan of the device. In addition, OLED devices are mainly formed by a deposition method, and it is necessary to develop a material that can withstand long time in deposition, that is, a material having high heat resistance characteristics.

That is, in order to sufficiently exhibit the excellent characteristics of the organic electronic element, a material for forming an organic material layer in an element such as a hole injection material, a hole transport material, a light emitting material, an electron transport material, an electron injection material, an emitting-auxiliary layer material should be supported by stable and efficient materials. However, such a stable and efficient organic material layer material for an organic electronic element has not been sufficiently developed yet. Therefore, development of new materials is continuously required.

PRIOR ART LITERATURE

Patent Literature (Patent Document 1) KR1020130076842 A

DETAILED DESCRIPTION OF THE INVENTION

Summary

In order to solve the problems of the background art described above, the present invention has revealed a compound having a novel structure, and that when the compound is applied to an organic electronic element, the luminous efficiency, stability and lifespan of the element are greatly improved.

Accordingly, it is an object of the present invention to provide a novel compound, an organic electronic element using the same, and an electronic device thereof.

Technical Solution

The present invention provides a compound represented by Formula 7.

<Formula 7>

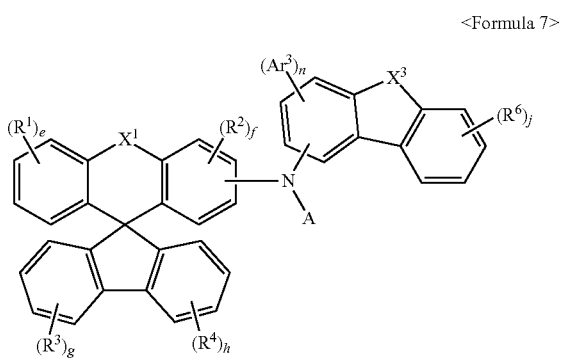

In another aspect, the present invention provides an organic electronic element comprising the compound represented by Formula 7 and an electronic device thereof.

Effects of the Invention

By using the compound according to the present invention, it is possible to achieve a high luminous efficiency, a low driving voltage, and a high heat resistance of the element, and can greatly improve the color purity and lifespan of the element.

Figure 1:
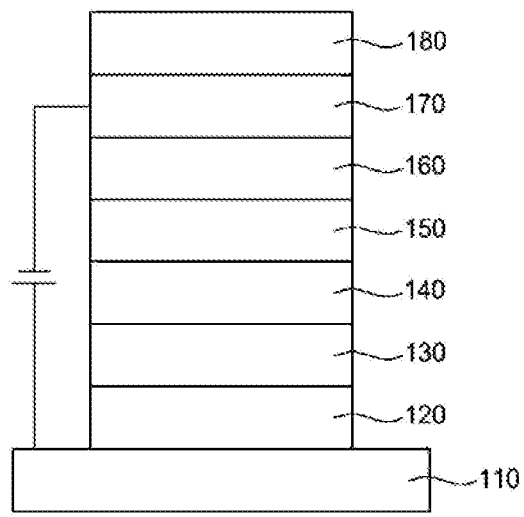
FIG. 1 to FIG. 3 illustrate an example of an organic electronic element according to the present invention.

| | |
|---|---|
| 100, 200, 300: | organic electronic element |
| 110: | the first electrode |
| 120: | hole injection layer |
| 130: | hole transport layer |
| 140: | emitting layer |
| 150: | electron transport layer |
| 160: | electron injection layer |
| 170: | second electrode |
| 180: | light efficiency enhancing Layer |
| 210: | buffer layer |
| 220: | emitting auxiliary layer |
| 320: | first hole injection layer |
| 330: | first hole transport layer |
| 340: | first emitting layer |
| 350: | first electron transport layer |
| 360: | first charge generation layer |
| 361: | second charge generation layer |
| 420: | second hole injection layer |
| 430: | second hole transport layer |
| 440: | second emitting layer |
| 450: | second electron transport layer |
| CGL: | charge generation layer |
| ST1: | first stack |
| ST2: | second stack |

DETAILED DESCRIPTION

Hereinafter, some embodiments of the present invention will be described in detail. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if a component is described as being "connected", "coupled", or "connected" to another component, the component may be directly connected or connected to the other component, but another component may be "connected","coupled" or "connected" between each component.

As used in the specification and the accompanying claims, unless otherwise stated, the following is the meaning of the term as follows.

Unless otherwise stated, the term "halo" or "halogen", as used herein, includes fluorine, bromine, chlorine, or iodine.

Unless otherwise stated, the term "alkyl" or "alkyl group", as used herein, has a single bond of 1 to 60 carbon atoms, and means saturated aliphatic functional radicals including a linear alkyl group, a branched chain alkyl group, a cycloalkyl group (alicyclic), an cycloalkyl group substituted with a alkyl or an alkyl group substituted with a cycloalkyl.

Unless otherwise stated, the term "alkenyl" or "alkynyl", as used herein, has double or triple bonds of 2 to 60 carbon atoms, but is not limited thereto, and includes a linear or a branched chain group.

Unless otherwise stated, the term "cycloalkyl", as used herein, means alkyl forming a ring having 3 to 60 carbon atoms, but is not limited thereto.

Unless otherwise stated, the term "alkoxyl group", "alkoxy group" or "alkyloxy group", as used herein, means an oxygen radical attached to an alkyl group, but is not limited thereto, and has 1 to 60 carbon atoms.

Unless otherwise stated, the term "aryloxyl group" or "aryloxy group", as used herein, means an oxygen radical attached to an aryl group, but is not limited thereto, and has 6 to 60 carbon atoms.

Unless otherwise stated, the term "aryl group" or "arylene group", as used herein, has 6 to 60 carbon atoms, but is not limited thereto. Herein, the aryl group or arylene group means a monocyclic and polycyclic aromatic group, and may also be formed in conjunction with an adjacent group. Examples of "aryl group" may include a phenyl group, a biphenyl group, a fluorene group, or a spirofluorene group.

The prefix "aryl" or "ar" means a radical substituted with an aryl group. For example, an arylalkyl may be an alkyl substituted with an aryl, and an arylalkenyl may be an alkenyl substituted with aryl, and a radical substituted with an aryl has a number of carbon atoms as defined herein.

Also, when prefixes are named subsequently, it means that substituents are listed in the order described first. For example, an arylalkoxy means an alkoxy substituted with an aryl, an alkoxylcarbonyl means a carbonyl substituted with an alkoxyl, and an arylcarbonylalkenyl also means an alkenyl substituted with an arylcarbonyl, wherein the arylcarbonyl may be a carbonyl substituted with an aryl.

Unless otherwise stated, the term "heterocyclic group", as used herein, contains one or more heteroatoms, but is not limited thereto, has 2 to 60 carbon atoms, includes any one of monocyclic and polycyclic rings, and may include heteroaliphatic ring and/or heteroaromatic ring. Also, the heterocyclic group may also be formed in conjunction with an adjacent group.

Unless otherwise stated, the term "heteroatom", as used herein, represents at least one of N, O, S, P, or Si.

Also, the term "heterocyclic group" may include a ring including SO₂ instead of carbon consisting of cycle. For example, "heterocyclic group" includes compound below.

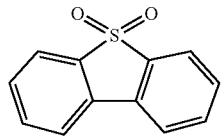 [SMILES: O=S1(=O)c2ccccc2-c2ccccc21]

Unless otherwise stated, the term "fluorenyl group" or "fluorenylene group", as used herein, means a monovalent or divalent functional group, in which R, R' and R" are all hydrogen in the following structures, and the term "substituted fluorenyl group" or "substituted fluorenylene group" means that at least one of the substituents R, R', R" is a substituent other than hydrogen, and include those in which R and R' are bonded to each other to form a spiro compound together with the carbon to which they are bonded.

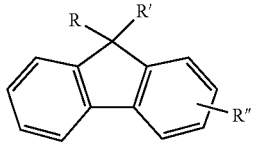

The term "spiro compound", as used herein, has a 'spiro union', and a spiro union means a connection in which two rings share only one atom. At this time, atoms shared in the two rings are called 'spiro atoms', and these compounds are called 'monospiro-', 'di-spiro-' and 'tri-spiro-', respectively, depending on the number of atoms in a compound.

Unless otherwise stated, the term "aliphatic", as used herein, means an aliphatic hydrocarbon having 1 to 60 carbon atoms, and the term "aliphatic ring", as used herein, means an aliphatic hydrocarbon ring having 3 to 60 carbon atoms.

Unless otherwise stated, the term "ring", as used herein, means an aliphatic ring having 3 to 60 carbon atoms, or an aromatic ring having 6 to 60 carbon atoms, or a hetero ring having 2 to 60 carbon atoms, or a fused ring formed by the combination of them, and includes a saturated or unsaturated ring.

Other hetero compounds or hetero radicals other than the above-mentioned hetero compounds include one or more heteroatoms, but are not limited thereto.

Unless otherwise stated, the term "substituted or unsubstituted", as used herein, means that substitution is substituted by at least one substituent selected from the group consisting of deuterium, halogen, an amino group, a nitrile group, a nitro group, a $C_1$-$C_{20}$ alkyl group, a $C_1$-$C_{20}$ alkoxyl group, a $C_1$-$C_{20}$ alkylamine group, a $C_1$-$C_{20}$ alkylthiophen group, a $C_6$-$C_{20}$ arylthiophen group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted by deuterium, a $C_8$-$C_{20}$ arylalkenyl group, a silane group, a boron group, a germanium group, and a $C_2$-$C_{20}$ heterocyclic group, but is not limited thereto.

Unless otherwise expressly stated, the Formula used in the present invention, as used herein, is applied in the same manner as the substituent definition according to the definition of the exponent of the following Formula.

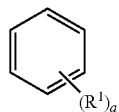

wherein, when a is an integer of zero, the substituent IV is absent, when a is an integer of 1, the sole substituent IV is linked to any one of the carbon constituting the benzene ring, when a is an integer of 2 or 3, each substituent TVs may be the same and different, when a is an integer of 4 to 6, and is linked to the benzene ring in a similar manner, whereas the indication of hydrogen bound to the carbon forming the benzene ring is omitted.

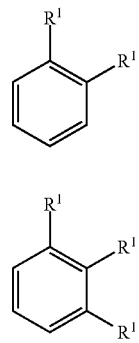

Hereinafter, a compound according to an aspect of the present invention and an organic electronic element comprising the same will be described.

The present invention provides a compound represented by Formula 7.

<Formula 7>

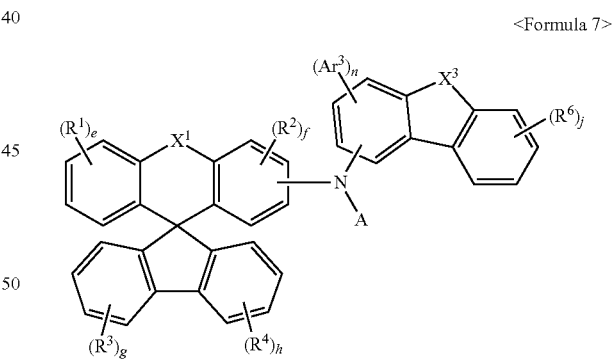

wherein, each symbol may be defined as follows.

$X^1$ and $X^3$ are each independently 0 or S, e, g, h and j are each independently an integer of 0 to 4, f and n are each independently 0 to 3, $R^1$, $R^2$, $R^3$, $R^4$, $R^6$ and $Ar^3$ are the same or different from each other and are each independently selected from the group consisting of hydrogen; deuterium; tritium; halogen; cyano group; nitro group; $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group;

When $R^1$, $R^2$, $R^3$, $R^4$, $R^6$ and $Ar^3$ are an aryl group, it is preferably an $C_6$-$C_{30}$ aryl group, more preferably an $C_6$-$C_{25}$ aryl group, such as phenyl, biphenyl, naphthalene, phenanthrene, etc.

When $R^1$, $R^2$, $R^3$, $R^4$, $R^6$ and $Ar^3$ are a heterocyclic group, it is preferably a $C_2$-$C_{30}$ heterocyclic group; and more preferably a $C_2$-$C_{24}$ heterocyclic group, for example, pyrazine, thiophene, pyridine, pyrimidoindole, 5-phenyl-5H-pyrimido[5,4-b]indole, quinazoline, benzoquinazoline, dibenzoquinazoline, dibenzofuran, dibenzothiophene, naphthobenzofuran, naphthobenzothiophene, benzothienopyrimidine, benzofuropyrimidine, phenothiazine, phenylphenothiazine, etc.

When $R^1$, $R^2$, $R^3$, $R^4$, $R^6$ and $Ar^3$ are a fused ring group, it is preferably a fused ring group of an $C_3$-$C_{30}$ aliphatic ring and an $C_6$-$C_{30}$ aromatic ring, more preferably a fused ring group of an $C_3$-$C_{24}$ aliphatic ring and an $C_6$-$C_{24}$ aromatic ring.

When $R^1$, $R^2$, $R^3$, $R^4$, $R^6$ and $Ar^3$ are an alkyl group, it is preferably an $C_1$-$C_{30}$ alkyl group, more preferably an $C_1$-$C_{24}$ alkyl group.

When $R^1$, $R^2$, $R^3$, $R^4$, $R^6$ and $Ar^3$ are an alkoxyl group, it is preferably an $C_1$-$C_{24}$ alkoxyl group, When $R^1$, $R^2$, $R^3$, $R^4$, $R^6$ and $Ar^3$ are an aryloxy group, it is preferably an $C_6$-$C_{24}$ aryloxy group, A is a substituent represented by Formula A-1; or a substituent represented by Formula A-2;

<Formula A-1>

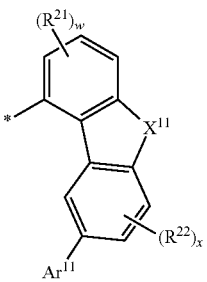

<Formula A-2>

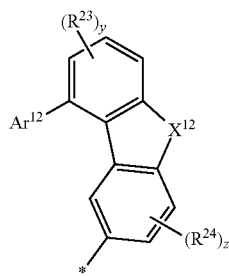

Wherein, $X^{11}$ and $X^{12}$ are each independently O or S, $Ar^{11}$ and $Ar^{12}$ are each independently selected from the group consisting of a $C_6$-$C_{60}$ aryl group; a fluorenyl group; a $C_2$-$C_{60}$ heterocyclic group including at least one heteroatom of O, N, S, Si or P; a fused ring group of a $C_3$-$C_{60}$ aliphatic ring and a $C_6$-$C_{60}$ aromatic ring; $C_1$-$C_{50}$ alkyl group; $C_2$-$C_{20}$ alkenyl group; $C_2$-$C_{20}$ alkynyl group; $C_1$-$C_{30}$ alkoxyl group; $C_6$-$C_{30}$ aryloxy group; and $C_3$-$C_{30}$ cycloalkyl group;

When $Ar^{11}$ and $Ar^{12}$ are an aryl group, it is preferably an $C_6$-$C_{30}$ aryl group, more preferably an $C_6$-$C_{25}$ aryl group, such as phenyl, biphenyl, terphenyl, naphthalene, phenanthrene, etc.

When $Ar^{11}$ and $Ar^{12}$ are a heterocyclic group, it is preferably a $C_2$-$C_{30}$ heterocyclic group; and more preferably a $C_2$-$C_{24}$ heterocyclic group, for example, pyrazine, thiophene, pyridine, pyrimidoindole, 5-phenyl-5H-pyrimido[5,4-b]indole, quinazoline, benzoquinazoline, dibenzoquinazoline, dibenzofuran, dibenzothiophene, naphthobenzofuran, naphthobenzothiophene, benzothienopyrimidine, benzofuropyrimidine, phenothiazine, phenylphenothiazine, etc.

When $Ar^{11}$ and $Ar^{12}$ are a fused ring group, it is preferably a fused ring group of an $C_3$-$C_{30}$ aliphatic ring and an $C_6$-$C_{30}$ aromatic ring, more preferably a fused ring group of an $C_3$-$C_{24}$ aliphatic ring and an $C_6$-$C_{24}$ aromatic ring.

When $Ar^{11}$ and $Ar^{12}$ are an alkyl group, it is preferably an $C_1$-$C_{30}$ alkyl group, more preferably an $C_1$-$C_{24}$ alkyl group, When $Ar^{11}$ and $Ar^{12}$ are an alkoxyl group, it is preferably an $C_1$-$C_{24}$ alkoxyl group, When $Ar^{11}$ and $Ar^{12}$ are an aryloxy group, it is preferably an $C_6$-$C_{24}$ aryloxy group, $R^{21}$, $R^{22}$, $R^{23}$ and $R^{24}$ are the same as the definition of $R^1$, w, x, y and z are each independently an integer of 0 to 3, wherein, the aryl group, heterocyclic group, fluorenyl group, fused ring group, alkyl group, alkenyl group, alkoxy group, aryloxy group and cycloalkyl group may be substituted with one or more substituents selected from the group consisting of deuterium; halogen; silane group; siloxane group; boron group; germanium group; cyano group; nitro group; $C_1$-$C_{20}$ alkylthio group; $C_1$-$C_{20}$ alkoxyl group; $C_1$-$C_{20}$ alkyl group; $C_2$-$C_{20}$ alkenyl group; $C_2$-$C_{20}$ alkynyl group; $C_6$-$C_{20}$ aryl group; $C_6$-$C_{20}$ aryl group substituted with deuterium; a fluorenyl group; $C_2$-$C_{20}$ heterocyclic group; $C_3$-$C_{20}$ cycloalkyl group; $C_7$-$C_{20}$ arylalkyl group; $C_8$-$C_{20}$ arylalkenyl group; and —L'—N($R_a$)($R_b$); wherein the substituents may be bonded to each other to form a saturated or unsaturated ring, wherein the term 'ring' means a $C_3$-$C_{60}$ aliphatic ring, a $C_6$-$C_{60}$ aromatic ring, or a $C_2$-$C_{60}$ heterocyclic group, or a fused ring formed by combination thereof.

Also, Formula 7 is represented by any one of Formulas 7-1 to 7-3.

<Formula 7-1>

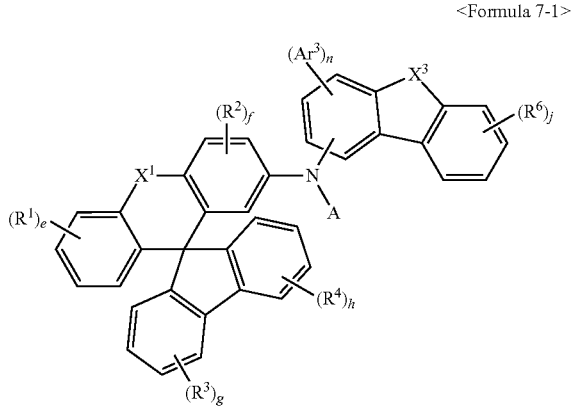

<Formula 7-2>
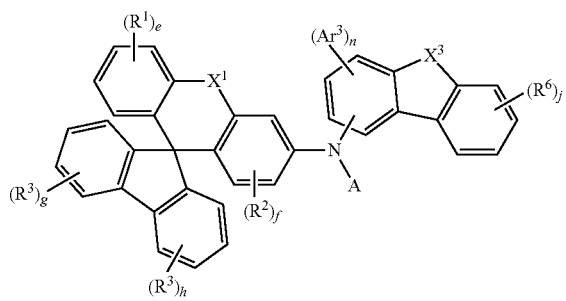
<Formula 7-3>
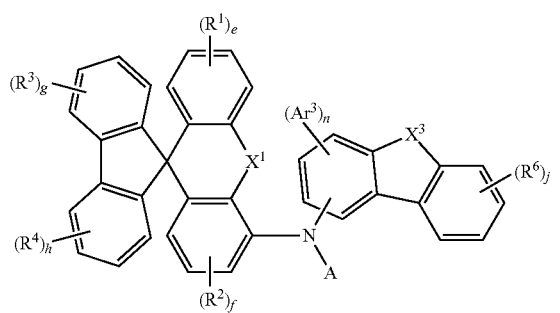
Wherein, $X^1$, $X^3$, $R^1$, $R^2$, $R^3$, $R^4$, $R^6$, $Ar^3$, e, f, g, h, j, n and A are the same as defined in Formula 7.
Also, Formula 7 is represented by any one of Formulas 7-4 to 7-7.
<Formula 7-4>
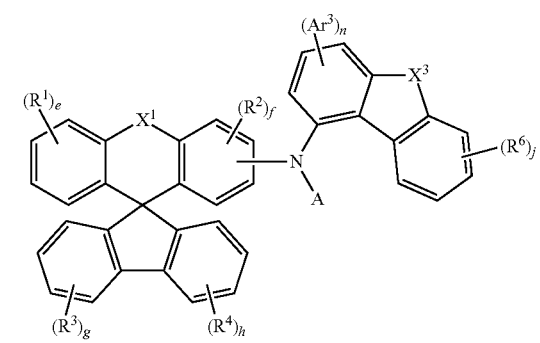
<Formula 7-5>
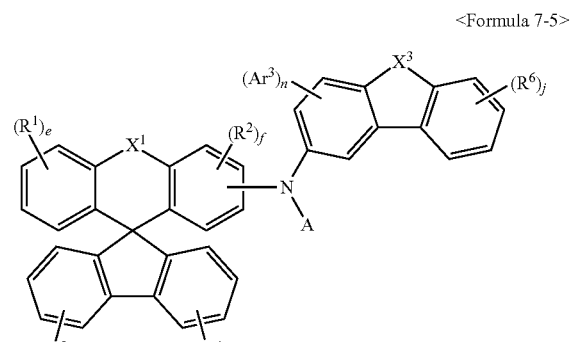
<Formula 7-6>
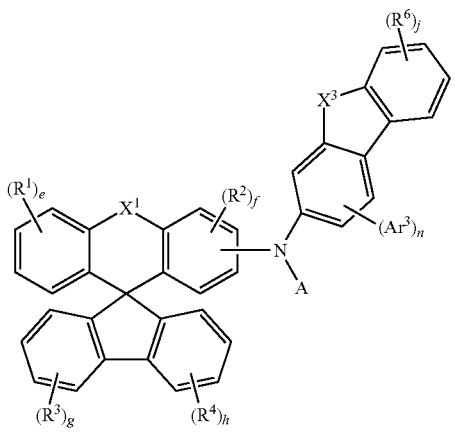
<Formula 7-7>
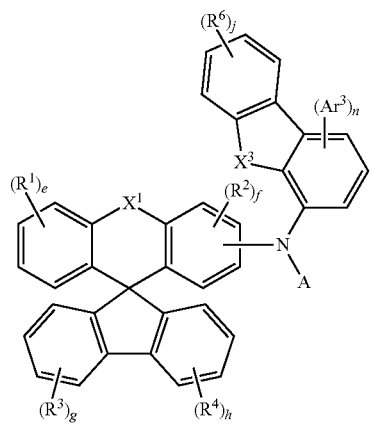
Wherein, $X^1$, $X^3$, $R^1$, $R^2$, $R^3$, $R^4$, $R^6$, $Ar^3$, e, f, g, h, j, n and A are the same as defined in Formula 7.
Formula 7 is represented by any one of Formulas 7-8 to 7-19.
<Formula 7-8>
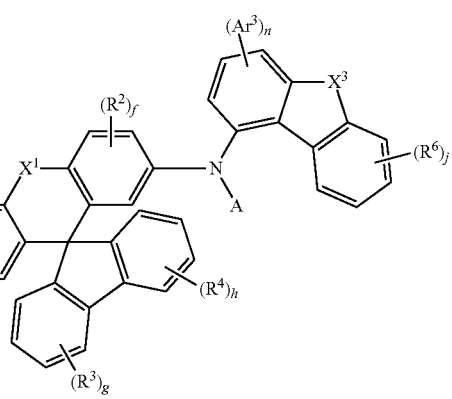

-continued
<Formula 7-9>
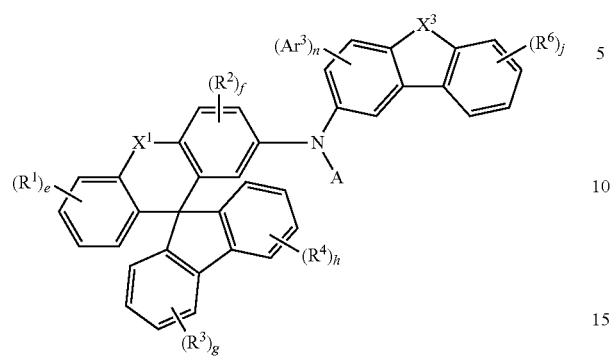
<Formula 7-10>
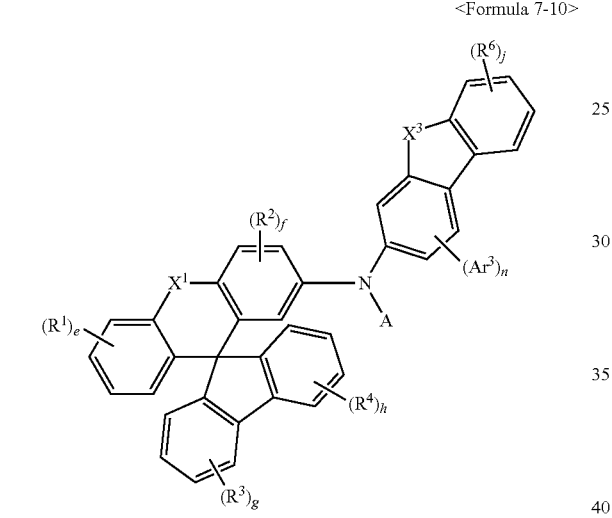
<Formula 7-11>
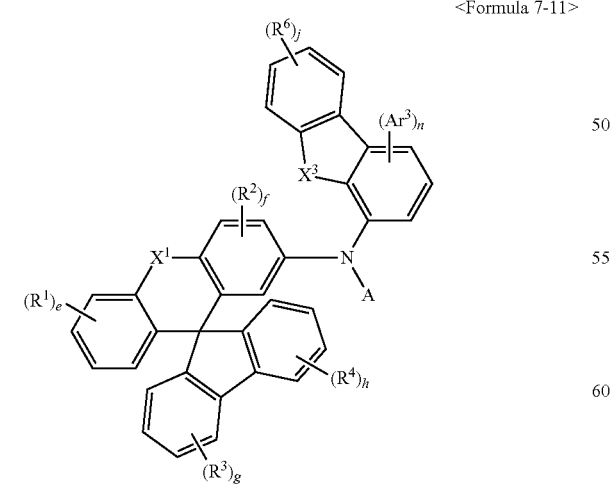
-continued
<Formula 7-12>
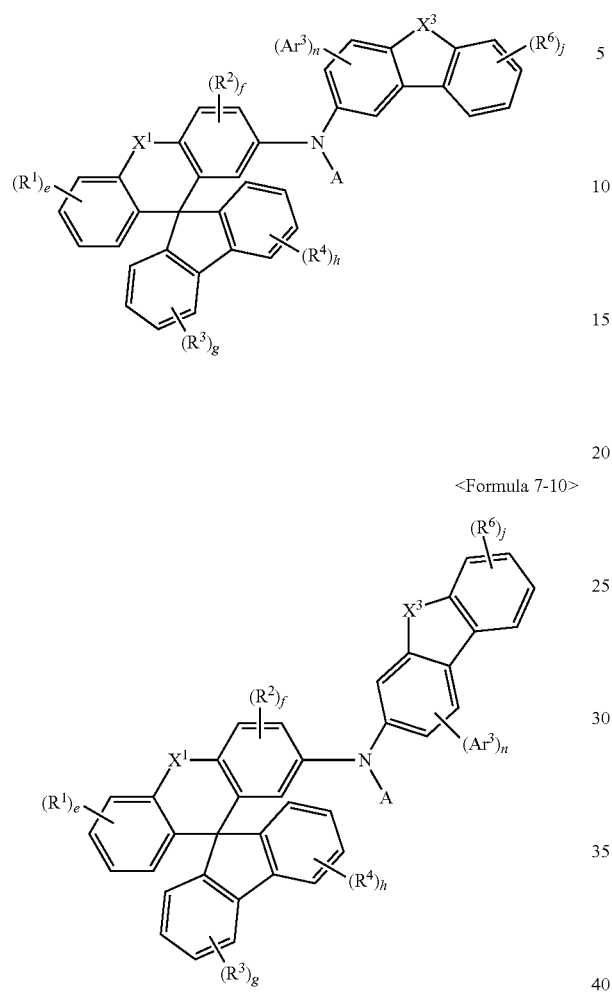
<Formula 7-13>
<Formula 7-14>
<Formula 7-15>

<Formula 7-16>
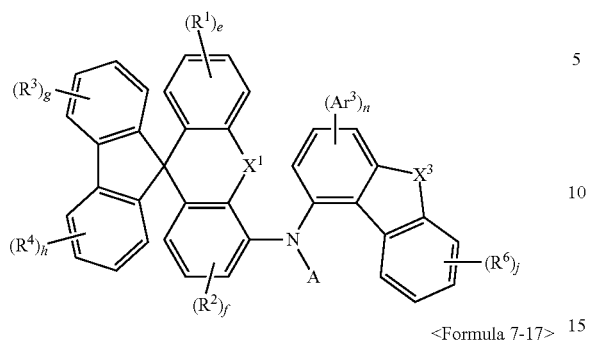
<Formula 7-17>
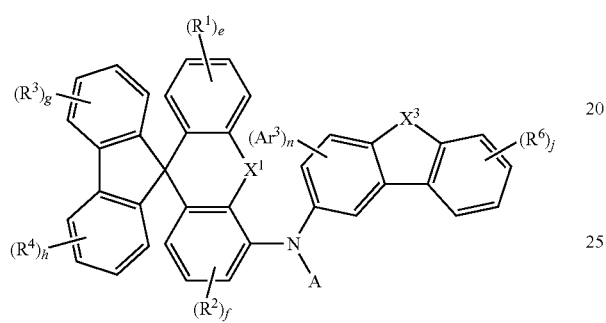
<Formula 7-18>
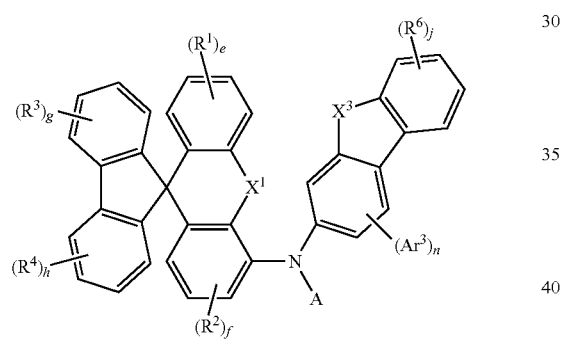
<Formula 7-19>
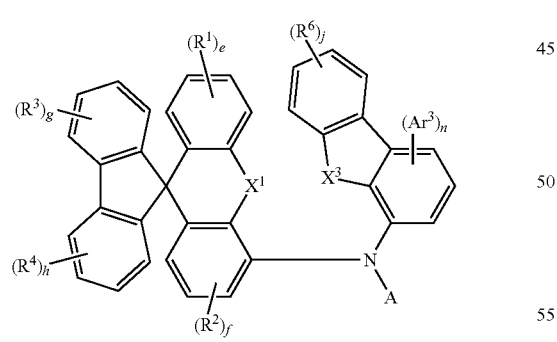
Wherein, $X^1$, $X^3$, $R^1$, $R^2$, $R^3$, $R^4$, $R^6$, $Ar^3$, e, f, g, h, j, n and A are the same as defined in Formula 7.
Specifically, the compound represented by Formula 7 may be a compound represented by any one of the following compounds P3-1 to compound P3-72, but is not limited thereto.
P3-1
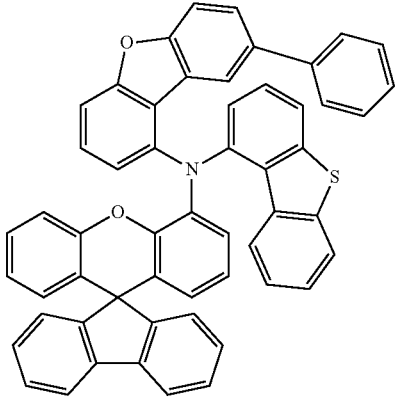
P3-2
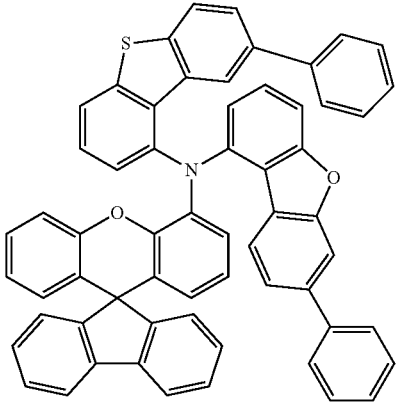
P3-3
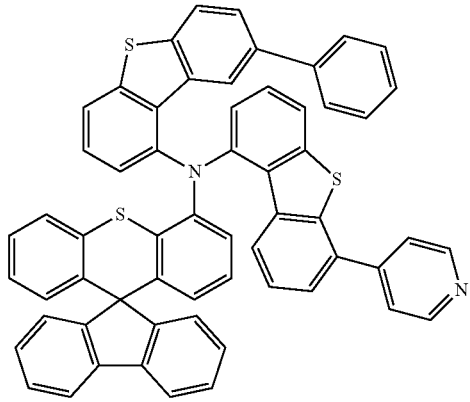

-continued
P3-4
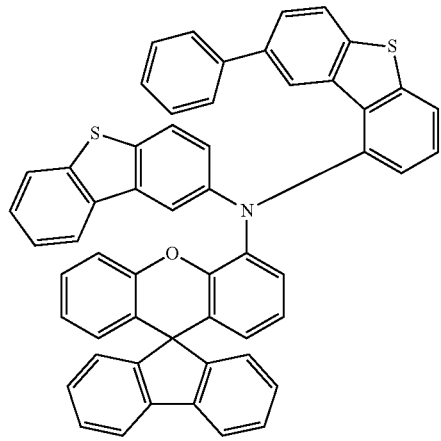
P3-5
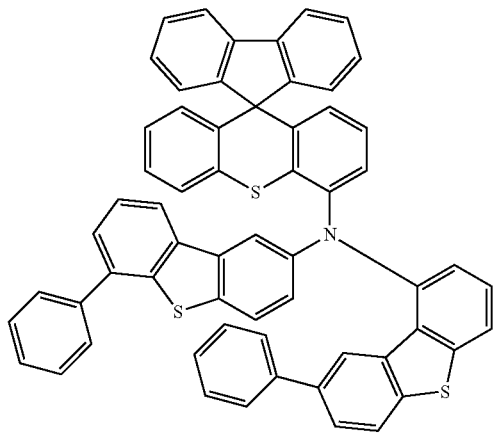
P3-6
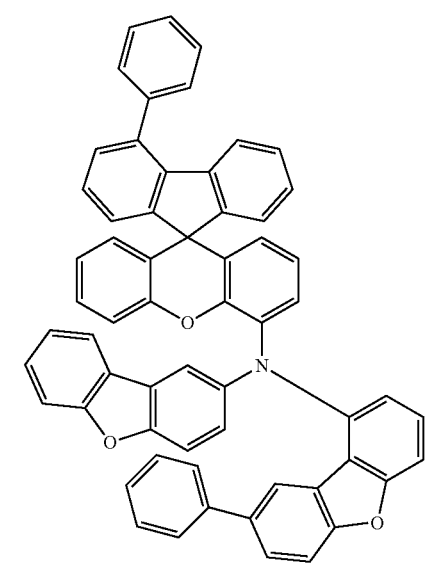
P3-7
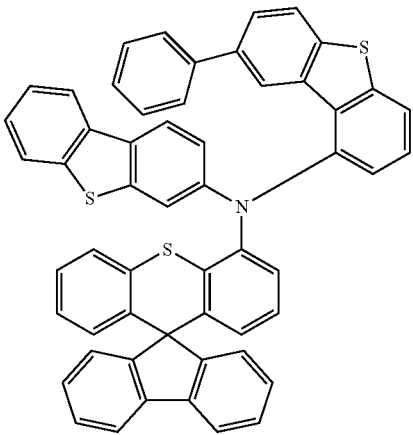
P3-8
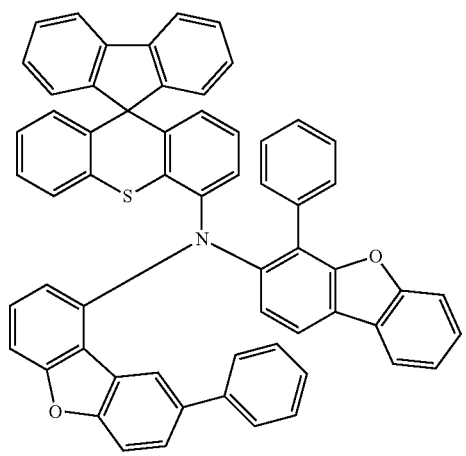
P3-9
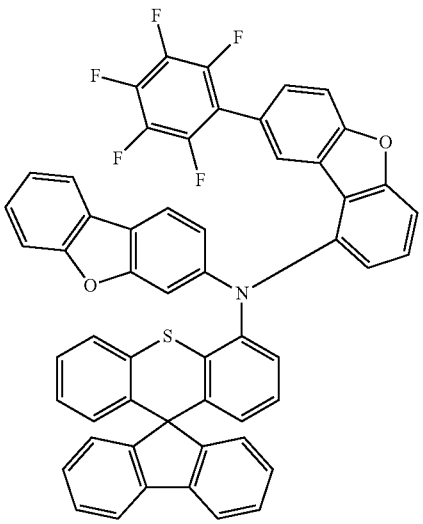

P3-10
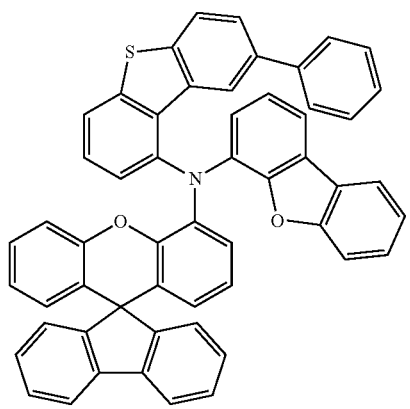
P3-11
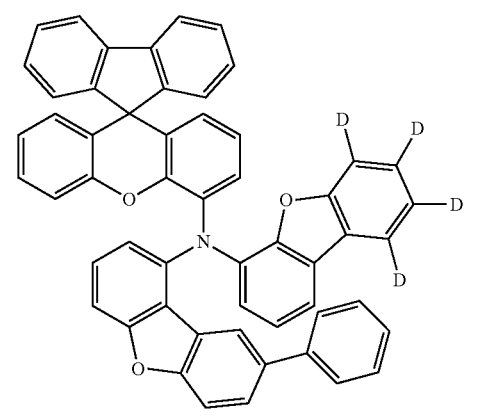
P3-12
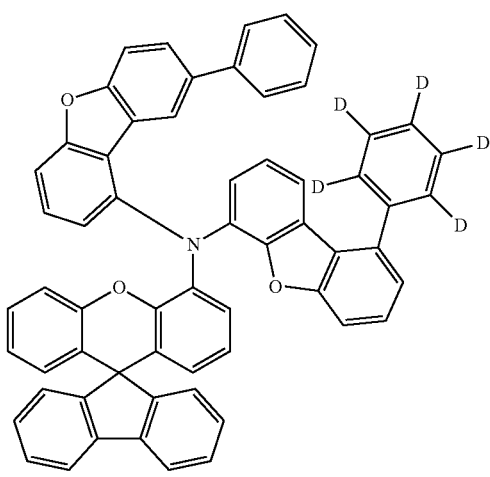
P3-13
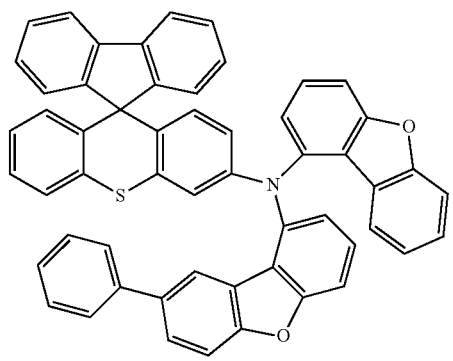
P3-14
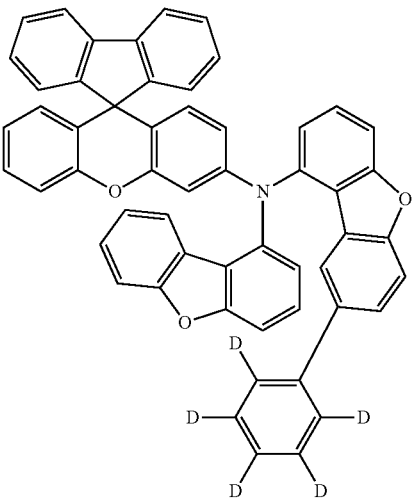
P3-15
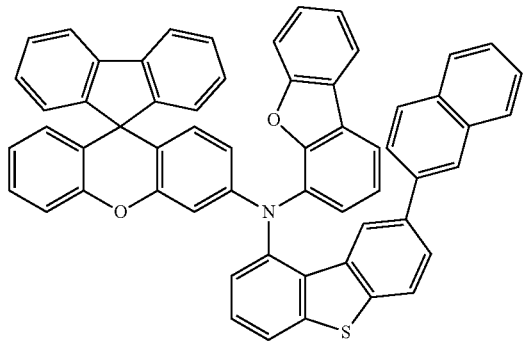

P3-16
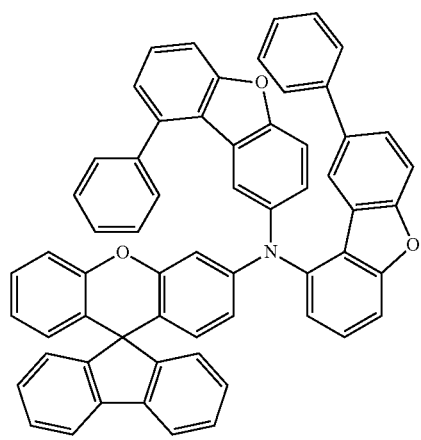
P3-17
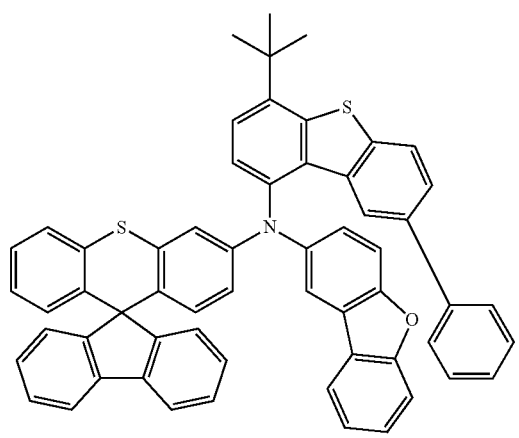
P3-18
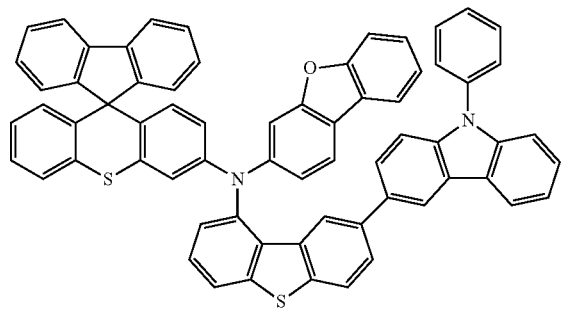
P3-19
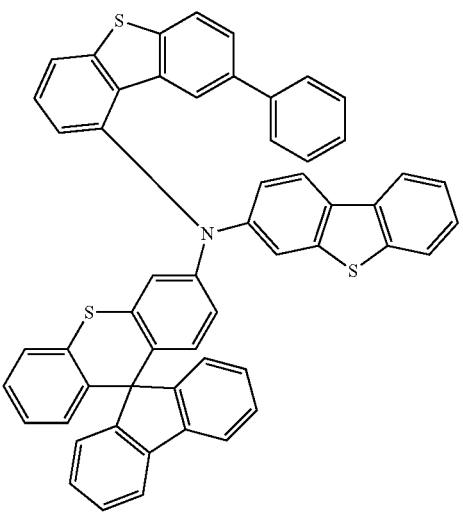
P3-20
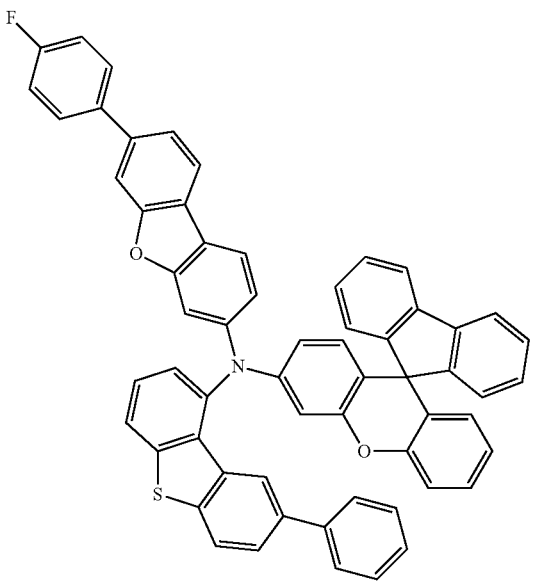
P3-21
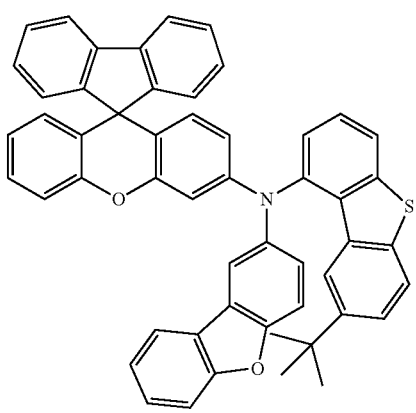

-continued
P3-22
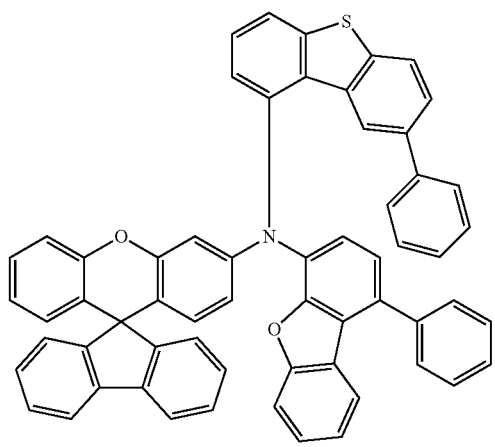
P3-23
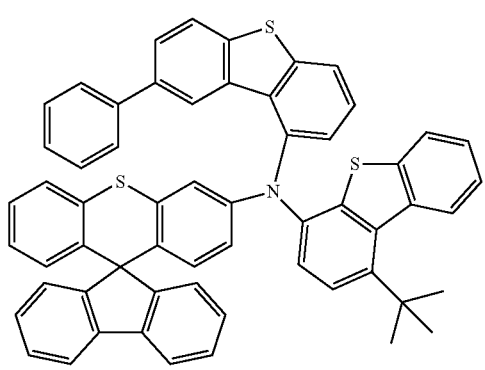
P3-24
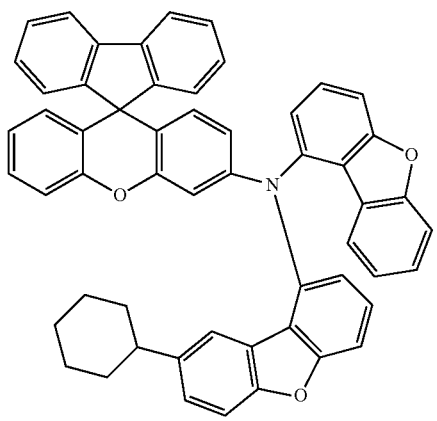
P3-25
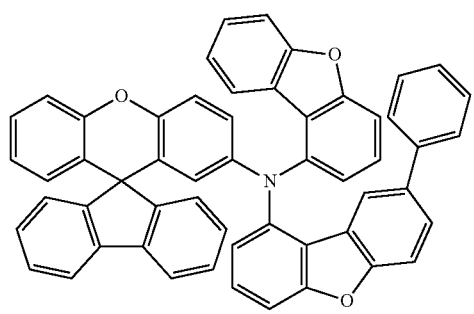
P3-26
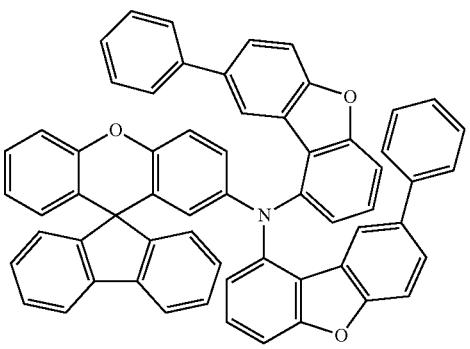
P3-27
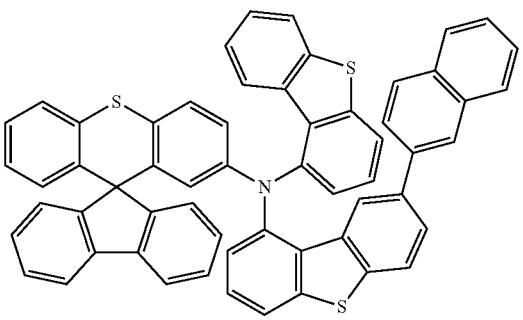
P3-28
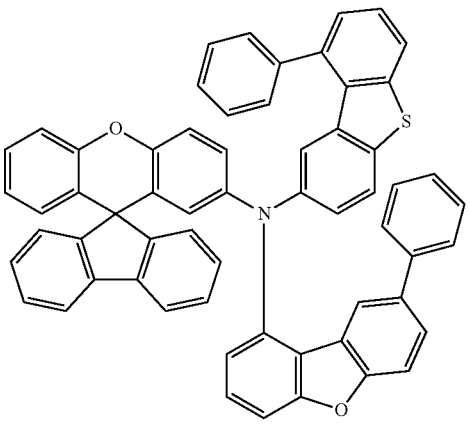
P3-29
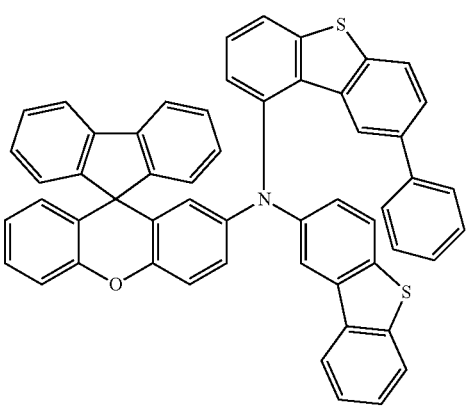

P3-30
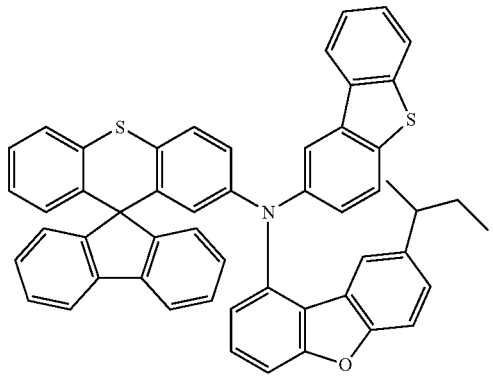
P3-33
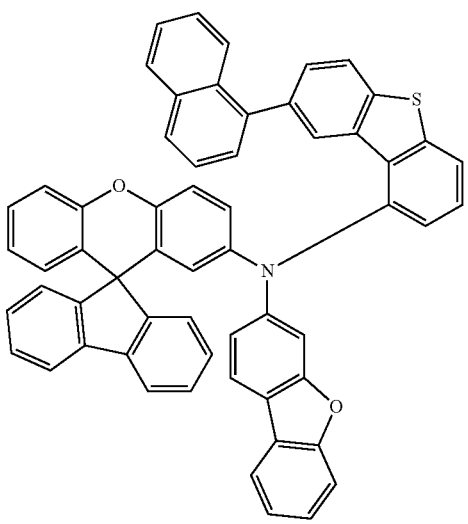
P3-31
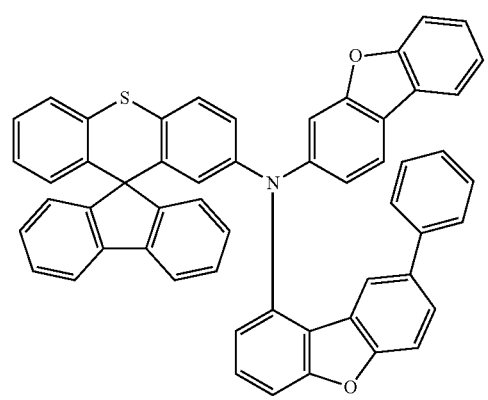
P3-34
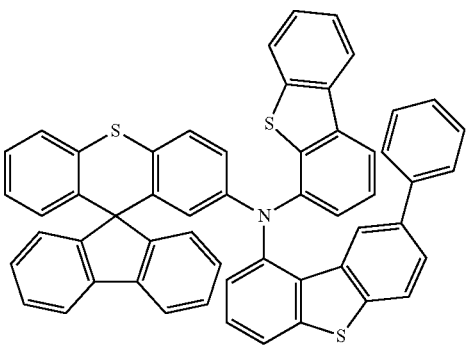
P3-32
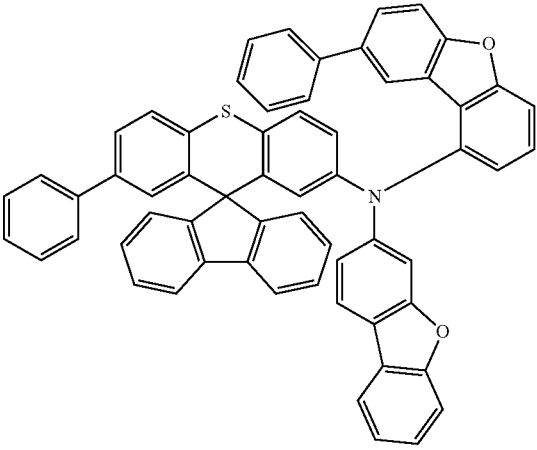
P3-35
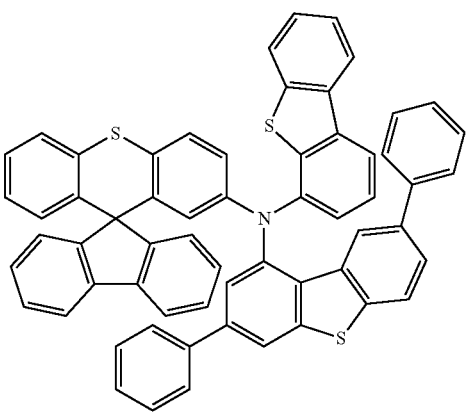

P3-36
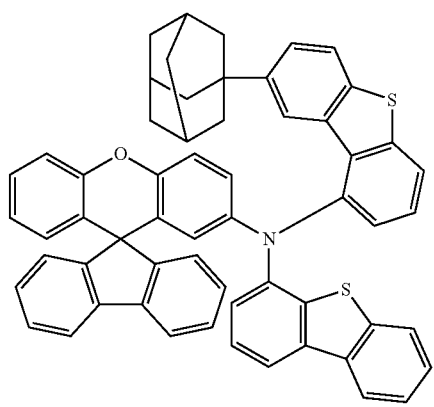
P3-37
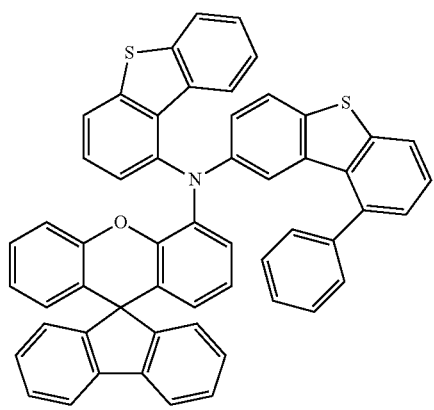
P3-28
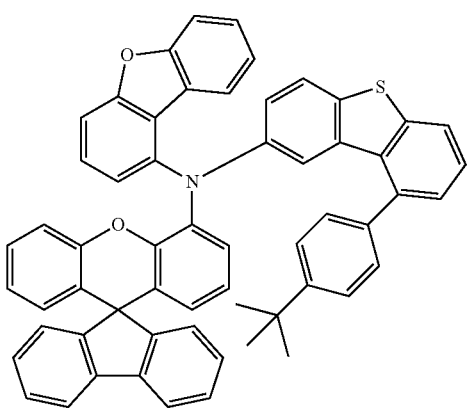
P3-39
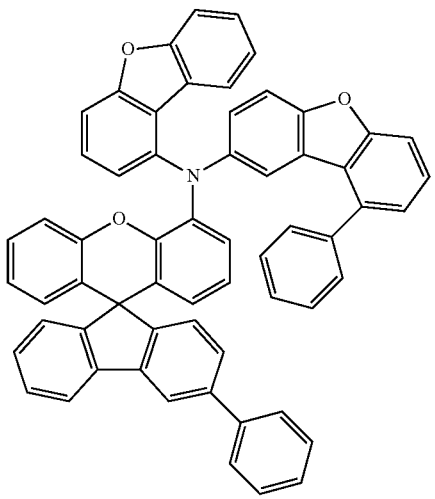
P3-40
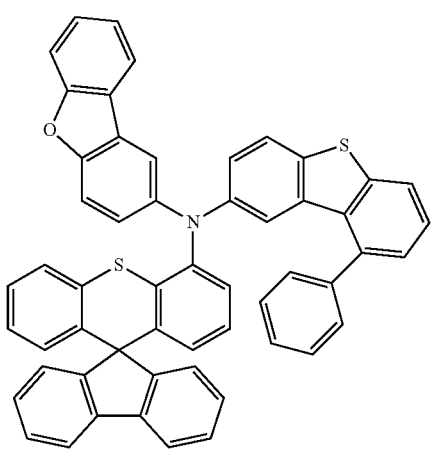
P3-41
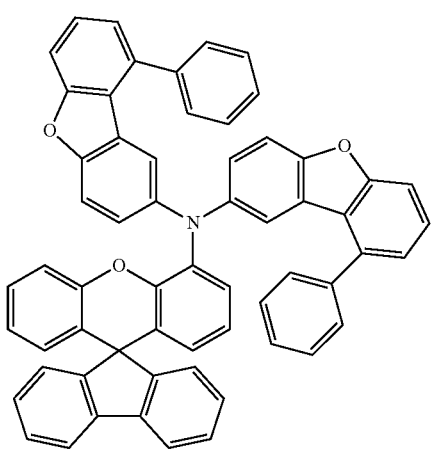

P3-42
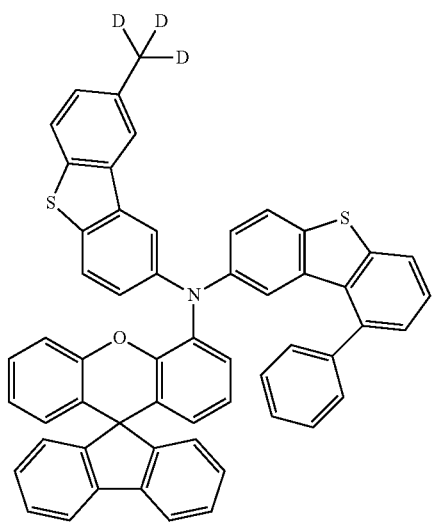
P3-43
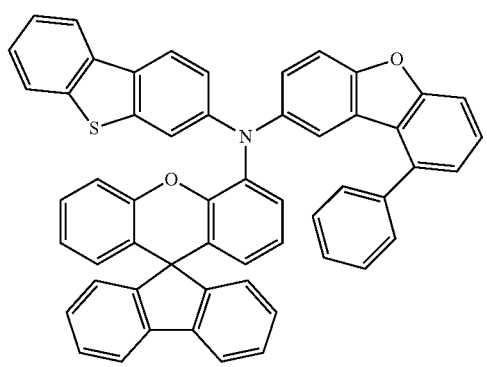
P3-44
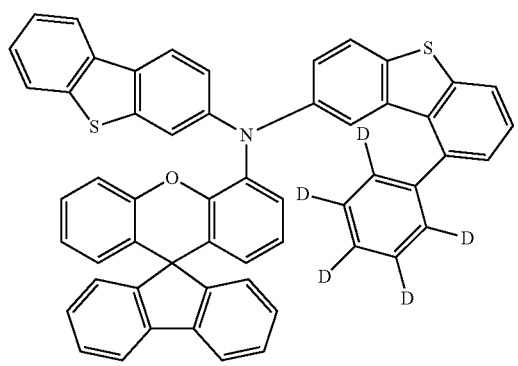
P3-45
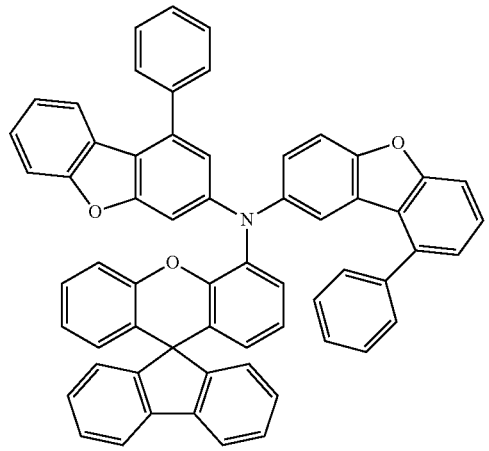
P3-46
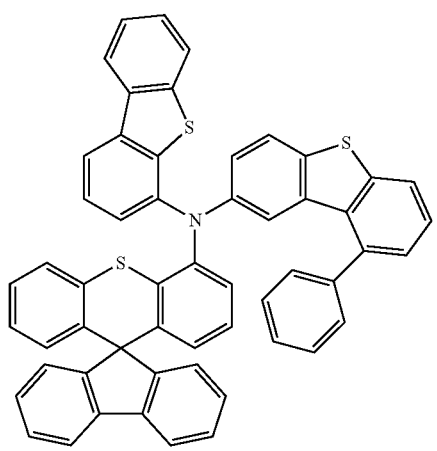
P3-47
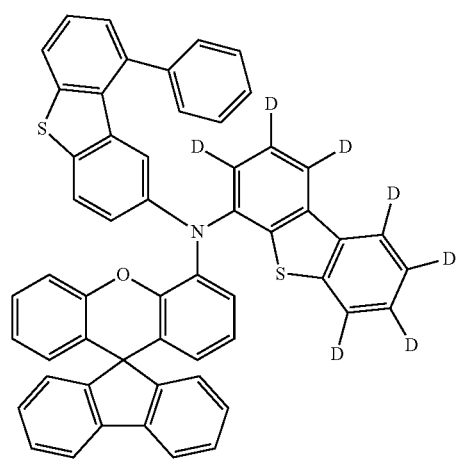

P3-48
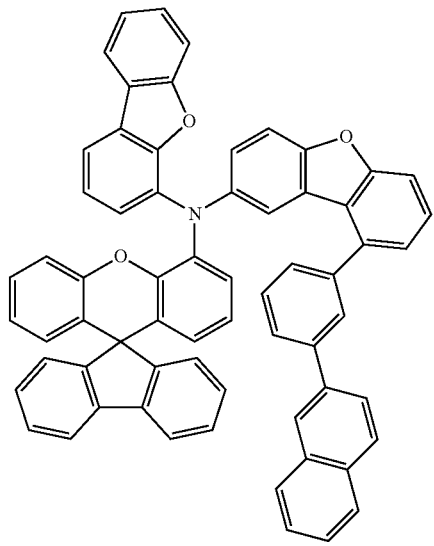
P3-49
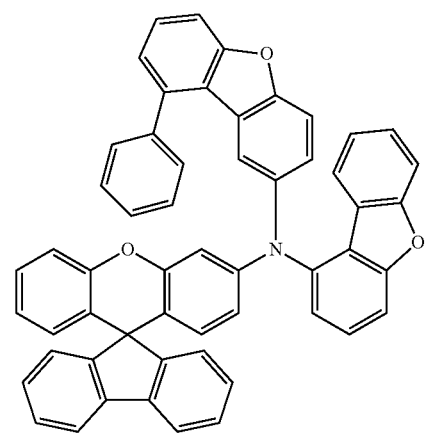
P3-50
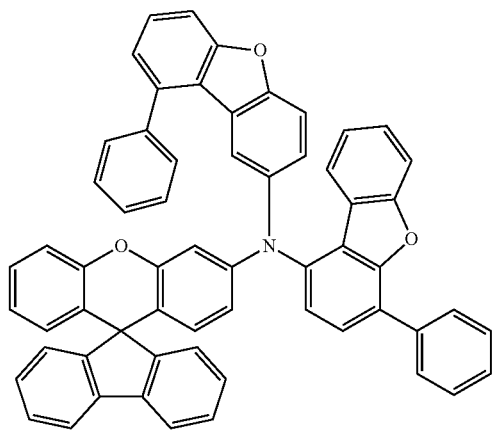
P3-51
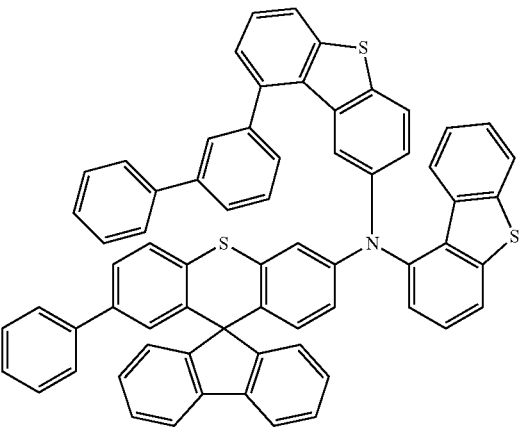
P3-52
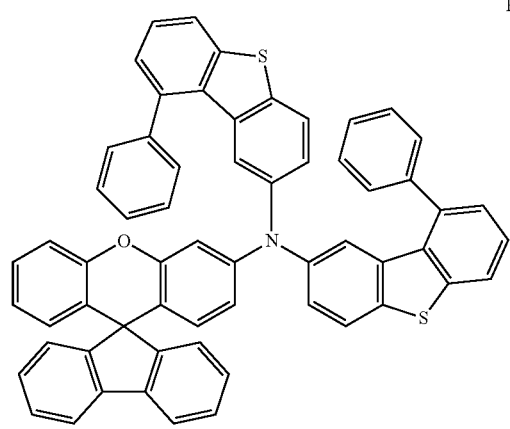
P3-53
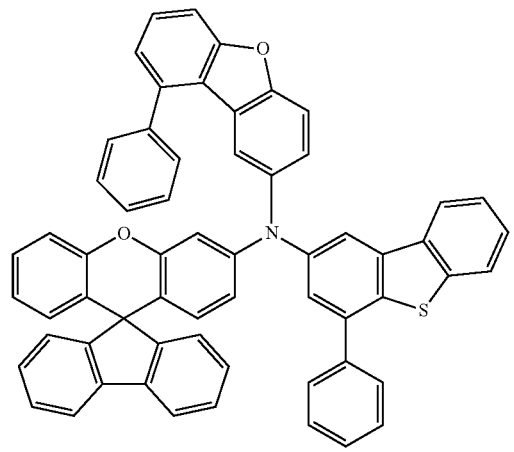

-continued
P3-54
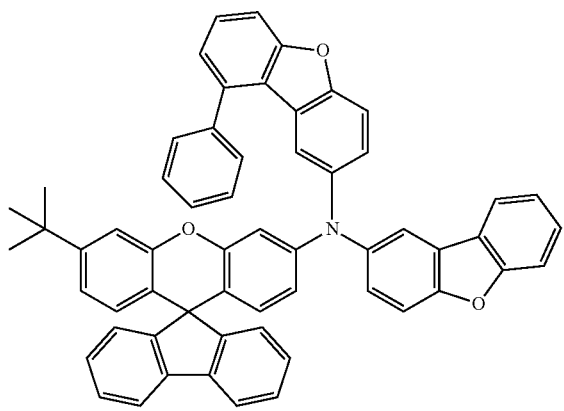
P3-55
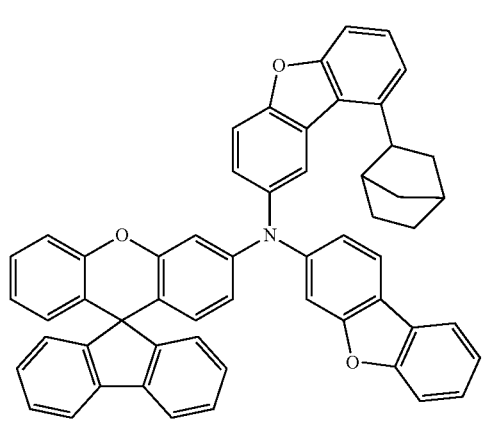
P3-56
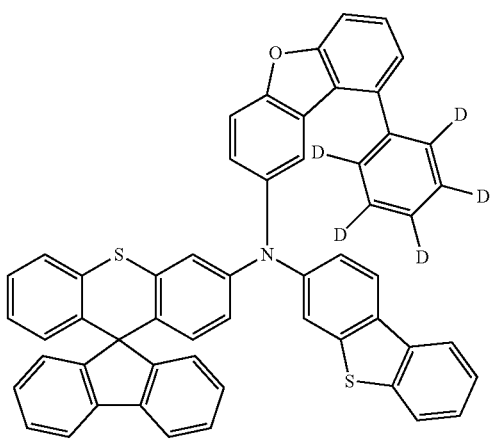
-continued
P3-57
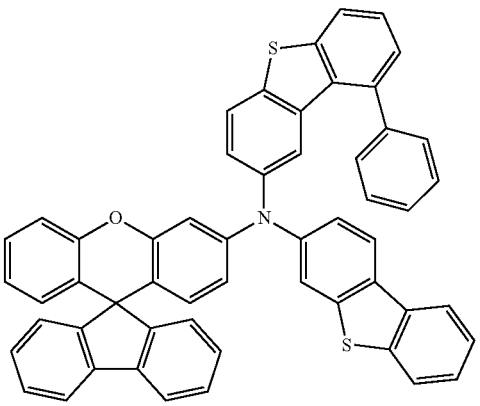
P3-58
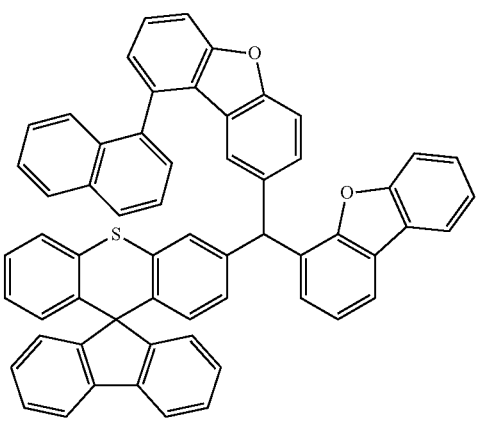
P3-59
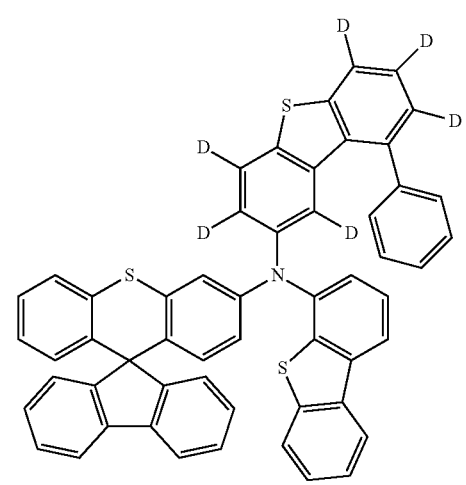

-continued
P3-60
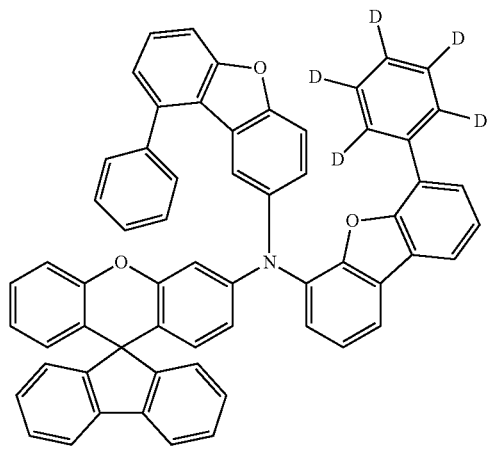
P3-61
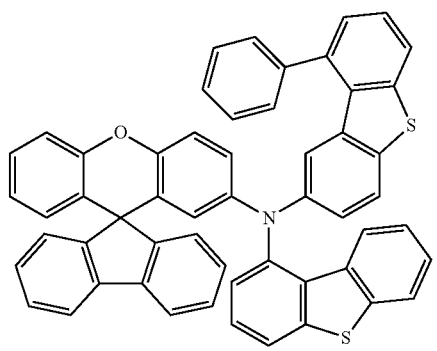
P3-62
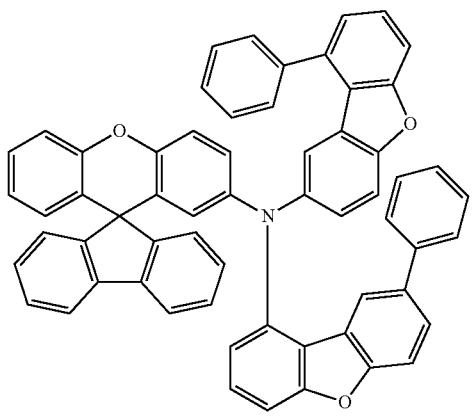
P3-63
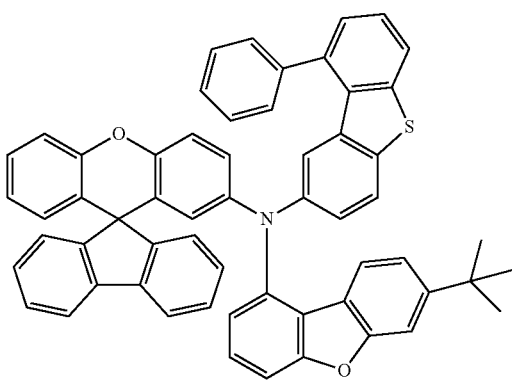
-continued
P3-64
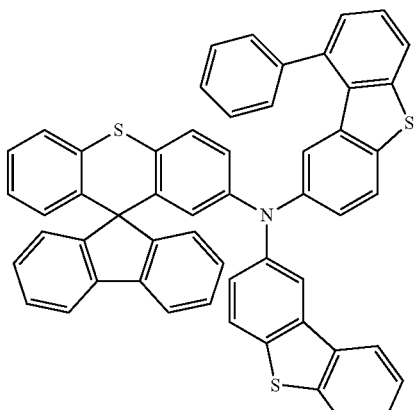
P3-65
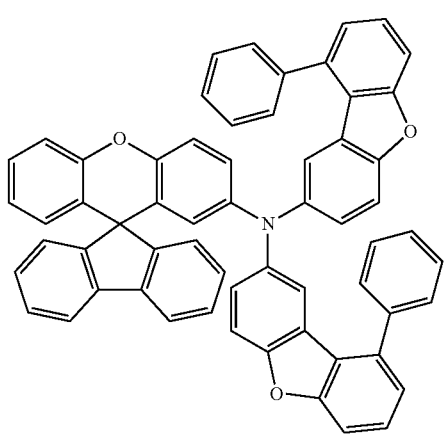
P3-66
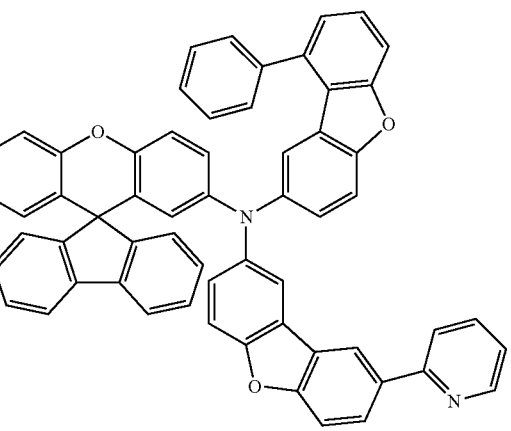

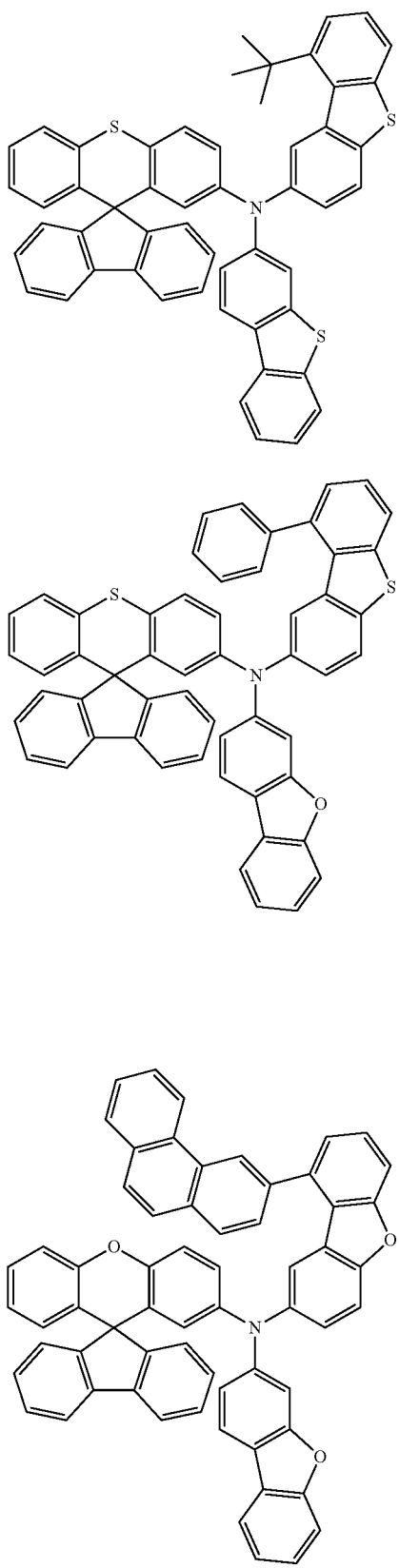

P3-67

P3-68

P3-69

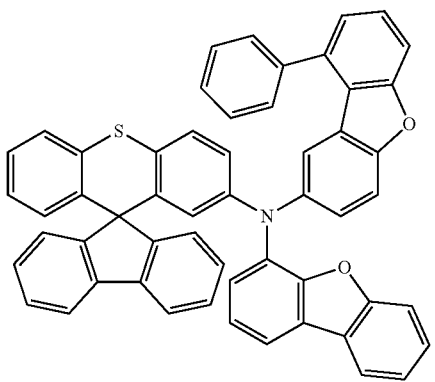

P3-70

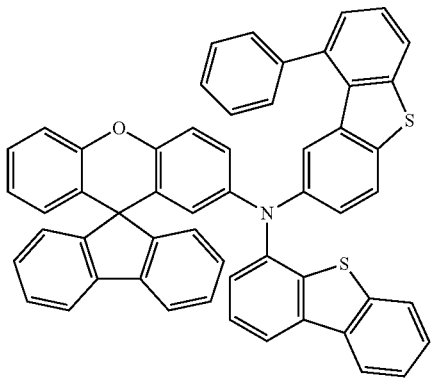

P3-71

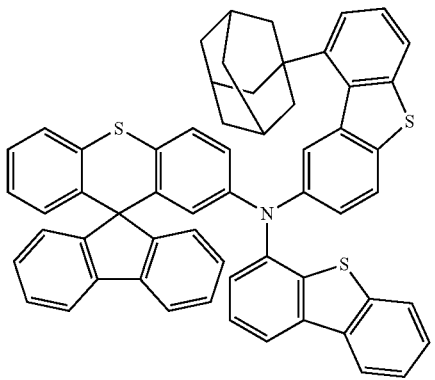

P3-72

Also, in another aspect, the present invention provides a method of reusing the compound represented by Formula 7 comprising:

the step of depositing an organic light emitting material including the compound represented by Formula 7 in the manufacturing process of the organic light emitting device;

the step of removing impurities of the crude organic light emitting material recovered from the deposition apparatus;

the step of recovering the removed impurities;

and the step of purifying the recovered impurities to a purity of 99.9% or more;

The step of removing impurities of the crude organic light emitting material recovered from the deposition apparatus may include performing a pre-refining process to obtain a purity of 98% or more by recrystallization preferably in a recrystallization solvent.

The recrystallization solvent may preferably be a polar solvent having a polarity index (PI) of 5.5 to 7.2.

Preferably, the recrystallization solvent may be used by mixing a polar solvent having a polarity value of 5.5 to 7.2 and a non-polar solvent having a polarity value of 2.0 to 4.7.

When the recrystallization solvent is used by mixing a polar solvent and a non-polar solvent, the non-polar solvent may be used in a ratio of 15% (v/v) or less compared to the polar solvent.

Wherein the recrystallization solvent may preferably use; a N-Methylpyrrolidone (NMP) solvent; or a mixed polar solvent mixed any one selected from the group consisting of dimethyl imidazolidinone (1,3-Dimethyl-2-imidazolidinone), 2-pyrrolidone, dimethylformamide (N,N-dimethyl formamide), dimethyl acetamide and dimethyl sulfoxide is mixed to the methylpyrrolidone; or a single; or a mixed non-polar solvent selected from the group consisting of toluene, Dichloromethane (DCM), Dichloroethane (DCE), Tetrahydrofuran (THF), Chloroform, Ethyl acetate and Butanone; or a mixture of the polar solvent and the non-polar solvent.

The preliminary refining process may comprise the step of cooling to 0° C. to 5° C. to precipitate crystals, after dissolving the crude organic light emitting material recovered from the deposition apparatus in a polar solvent at 90° C. to 120° C.

The preliminary refining process may comprise the step of cooling to 35° C. to 40° C., adding anon-polar solvent, and then cooling to 0° C. to 5° C. to precipitate crystals, after dissolving the crude organic light emitting material recovered from the deposition apparatus in a polar solvent at 90° C. to 120° C.

The preliminary purification process may comprise the step of precipitating crystals while concentrating the solvent and removing the non-polar solvent, after dissolving the crude organic light emitting material recovered from the deposition apparatus in a non-polar solvent.

The preliminary purification process may comprise the step of recrystallization again with a non-polar solvent, after recrystallization first with a polar solvent The step of purifying the recovered impurities to a purity of 99.9% or more may include the step of performing an adsorption separation process for adsorbing and removing impurities by adsorbing them to an adsorbent.

The adsorbent may be activated carbon, silica gel, alumina or a material for known adsorption applications.

The step of purifying the recovered impurities to a purity of 99.9% or more may include performing sublimation purification.

Referring to FIG. 1, the organic electronic element (100) according to the present invention includes a first electrode (110), a second electrode (170), an organic material layer comprising single compound represented by Formula 7 or 2 or more compounds between the first electrode (110) and the second electrode (170). Wherein, the first electrode (110) may be an anode or a positive electrode, and the second electrode (170) may be a cathode or a negative electrode. In the case of an inverted organic electronic element, the first electrode may be a cathode, and the second electrode may be an anode.

Figure 2:
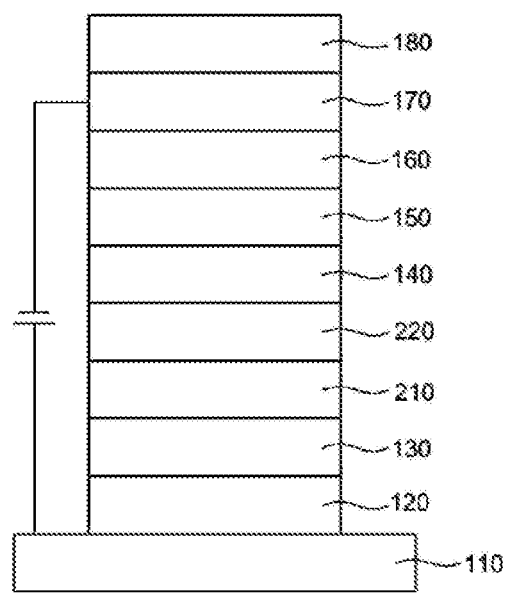

The organic material layer may sequentially include a hole injection layer (120), a hole transport layer (130), an emitting layer (140), an electron transport layer(150), and an electron injection layer (160) formed in sequence on the first electrode(110). Here, the remaining layers except the emitting layer (140) may not be formed. The organic material layer may further include a hole blocking layer, an electron blocking layer, an emitting-auxiliary layer (220), a buffer layer (210), etc., and the electron transport layer (150) and the like may serve as a hole blocking layer (see FIG. 2).

Also, the organic electronic element according to an embodiment of the present invention may further include a protective layer or a light efficiency enhancing layer (180).

The light efficiency enhancing layer may be formed on a surface of both surfaces of the first electrode, the surface not in contact with the organic material layer or on a surface of both surfaces of the second electrode, the surface not in contact with the organic material layer. The compound according to an embodiment of the present invention applied to the organic material layer may be used as a material for a hole injection layer (120), a hole transport layer (130), an emitting-auxiliary layer (220), an electron transport auxiliary layer, an electron transport layer (150), an electron injection layer (160), a host or dopant of an emitting layer (140) or the light efficiency enhancing layer. Preferably, for example, the compound according to Formula 7 of the present invention may be used as a material for the emitting-auxiliary layer.

Figure 3:
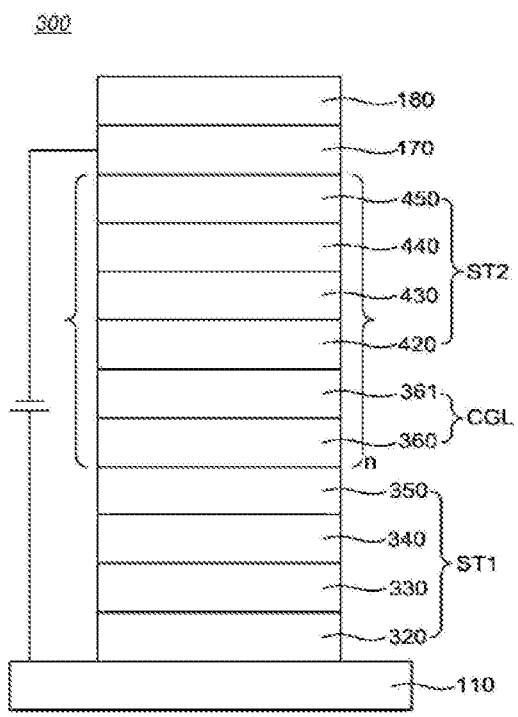
Figure 4:
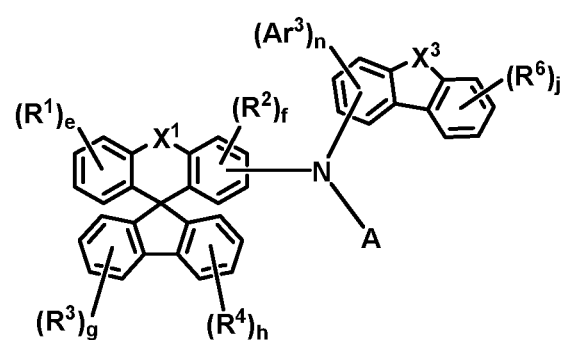
FIG. 4 shows a Formula according to one aspect of the present invention.

The organic material layer may comprise 2 or more stacks including a hole transport layer, an emitting layer, and an electron transport layer sequentially formed on the anode, and may further include a charge generation layer formed between the 2 or more stacks (see FIG. 3).

Otherwise, even if the same core is used, the band gap, the electrical characteristics, the interface characteristics, and the like may vary depending on which substituent is bonded at which position, therefore the choice of core and the combination of sub-substituents associated therewith is also very important, and in particular, when the optimal combination of energy levels and T1 values and unique properties of materials(mobility, interfacial characteristics, etc.) of each organic material layer is achieved, a long life span and high efficiency can be achieved at the same time.

The organic electroluminescent device according to an embodiment of the present invention may be manufactured using a PVD (physical vapor deposition) method. For example, a metal or a metal oxide having conductivity or an alloy thereof is deposited on a substrate to form a cathode, and the organic material layer including the hole injection layer(120), the hole transport layer(130), the emitting layer (140), the electron transport layer(150), and the electron injection layer(160) is formed thereon, and then depositing a material usable as a cathode thereon can manufacture an organic electroluminescent device according to an embodiment of the present invention.

Also, the present invention provides the organic electronic element wherein the organic material layer is formed by one of a spin coating process, a nozzle printing process, an inkjet printing process, a slot coating process, a dip coating process or a roll-to-roll process, and the organic material layer provides an organic electronic element comprising the compound as an electron transport material.

As another specific example, the present invention provides an organic electronic element that is used by mixing the same or different compounds of the compound represented by Formula 7 to the organic material layer.

In another aspect, the present invention provides an emitting-auxiliary layer composition comprising a compound represented by Formula 7, and provides an organic electronic element comprising the emitting-auxiliary layer.

Also, the present invention also provides an electronic device comprising a display device including the organic electronic element; and a control unit for driving the display device.

According to another aspect, the present invention provides an display device wherein the organic electronic element is at least one of an OLED, an organic solar cell, an organic photo conductor, an organic transistor(organic TFT) and an element for monochromic or white illumination. Here, the electronic device may be a wired/wireless communication terminal which is currently used or will be used in the future, and covers all kinds of electronic devices including a mobile communication terminal such as a cellular phone, a personal digital assistant(PDA), an electronic dictionary, a point-to-multipoint(PMP), a remote controller, a navigation unit, a game player, various kinds of TVs, and various kinds of computers.

Hereinafter, Synthesis Examples of the compound represented by Formula 7 of the present invention and preparation examples of the organic electronic element of the present invention will be described in detail by way of example, but are not limited to the following examples.

Synthesis Example 1

The compound (Final product) represented by Formula 7 according to the present invention is synthesized by reacting Sub5 and sub6 as in Reaction Scheme 3, but is not limited thereto. (Hal² = Br or Cl)

<Reaction Scheme 3>

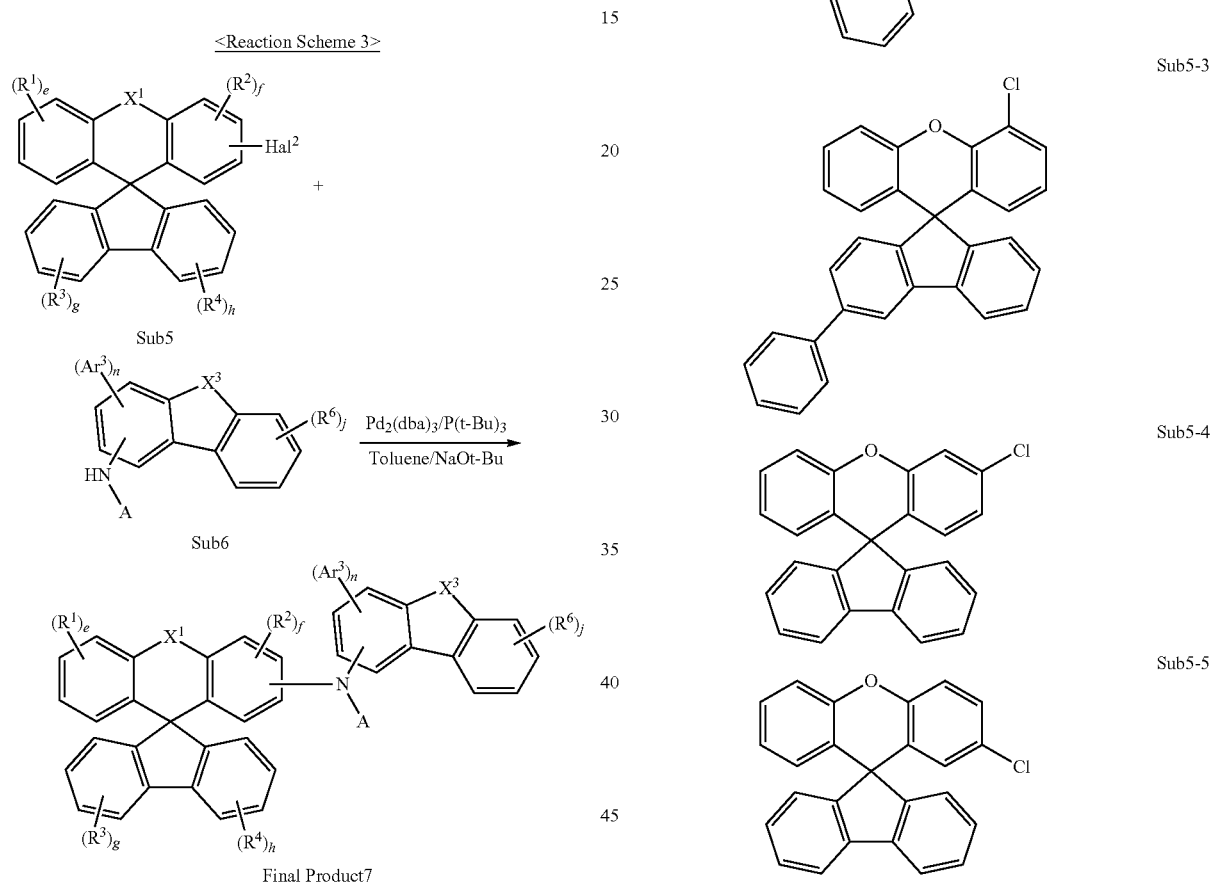

Final Product7

I. Synthesis of Sub 5

The compound belonging to Sub 5 of the Reaction Scheme 3 may be a compound as follows, but is not limited thereto, and Table 1 shows FD-MS (Field Desorption-Mass Spectrometry) values of the compound belonging to Sub 5.

Sub5-1

Sub5-2

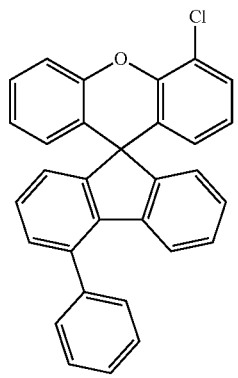

Sub5-3

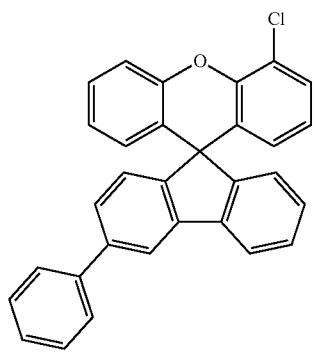

Sub5-4

Sub5-5

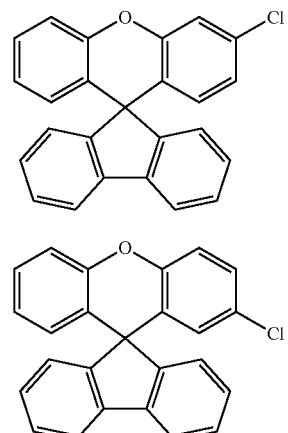

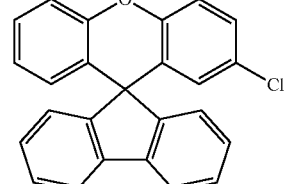

Sub5-6

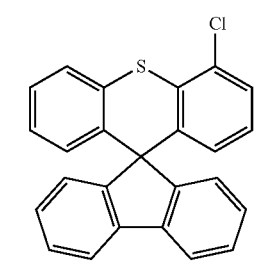

Sub5-7

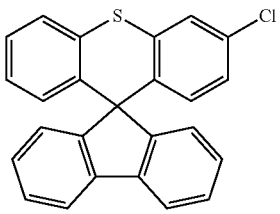

-continued

Sub5-8

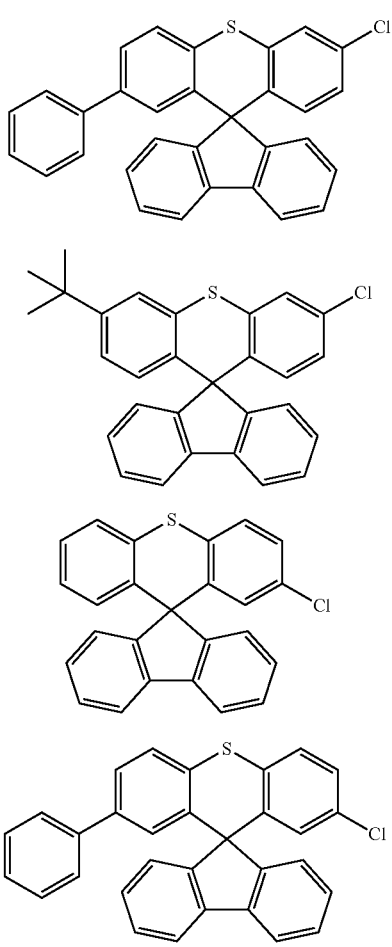

Sub5-9

Sub5-10

Sub5-11

-continued

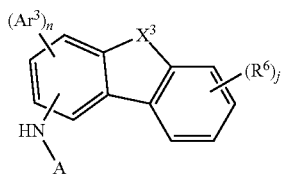

Sub6

1. Synthesis example of Sub6-1

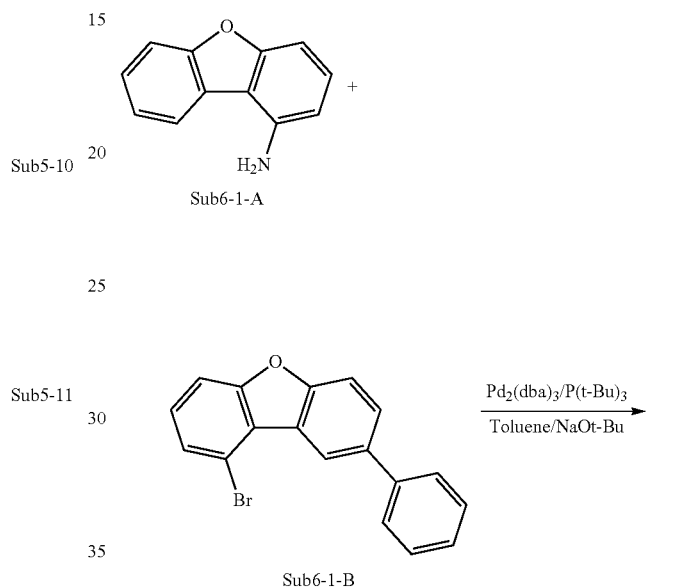

Sub6-1-A

Sub6-1-B

TABLE 1

| compound | FD-MS | compound | FD-MS |
|---|---|---|---|
| Sub5-1 | m/z = 366.08($C_{25}H_{15}ClO$ = 366.84) | Sub5-2 | m/z = 442.11($C_{31}H_{19}ClO$ = 442.94) |
| Sub5-3 | m/z = 442.11($C_{31}H_{19}ClO$ = 442.94) | Sub5-4 | m/z = 366.08($C_{25}H_{15}ClO$ = 366.84) |
| Sub5-5 | m/z = 366.08($C_{25}H_{15}ClO$ = 366.84) | Sub5-6 | m/z = 382.06($C_{25}H_{15}ClS$ = 382.9) |
| Sub5-7 | m/z = 382.06($C_{25}H_{15}ClS$ = 382.9) | Sub5-8 | m/z = 458.09($C_{31}H_{19}ClS$ = 459) |
| Sub5-9 | m/z = 438.12($C_{29}H_{23}ClS$ = 439.01) | Sub5-10 | m/z = 382.06($C_{25}H_{15}ClS$ = 382.9) |
| Sub5-11 | m/z = 458.09($C_{31}H_{19}ClS$ = 459) | | |

II. Synthesis of Sub 6

Sub6 of Reaction Scheme 3 is synthesized by the reaction pathway of Reaction Scheme 4, but is not limited thereto.

<Reaction Scheme 4>

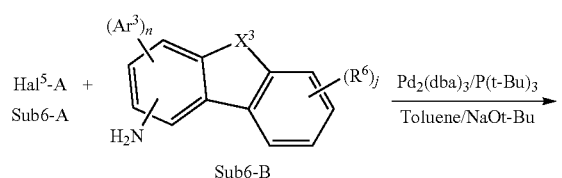

-continued

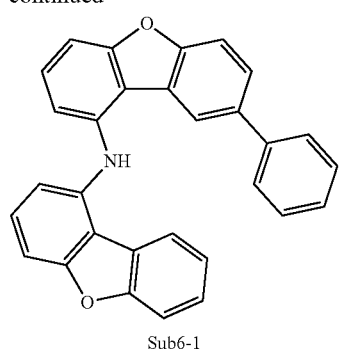

Sub6-1

Sub6-1-A (10.0 g, 54.6 mmol) was dissolved in toluene (273 mL) in a round bottom flask, Pd$_2$(dba)$_3$ (1.50 g, 1.64 mmol), P(t-Bu)$_3$ (0.66 g, 3.27 mmol), NaOt-Bu (10.5 g, 109 mmol) were added and reacted proceeded at 80° C. When the reaction is complete, the mixture was extracted with CH$_2$C$_{12}$ and water, the organic layer was dried over MgSO$_4$, concentrated, and the resulting compound was recrystallized by silicagel column to obtain 18.1 g (yield: 78%) of the product.

2. Synthesis example of Sub6-8

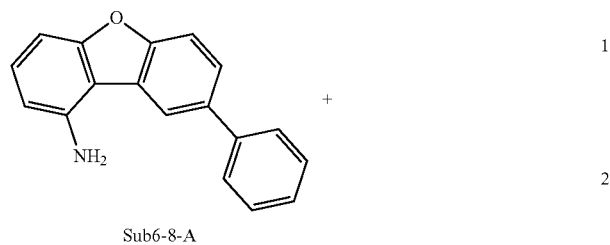

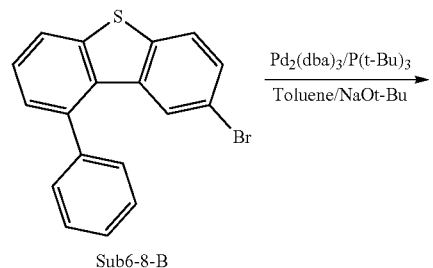

Sub6-8-A (10.0 g, 38.6 mmol) was dissolved in toluene (193 mL) in a round bottom flask, Sub6-8-B (13.1 g, 38.6 mmol), Pd$_2$(dba)$_3$ (1.06 g, 1.16 mmol), P(t-Bu)$_3$ (0.47 g, 2.31 mmol), NaOt-Bu (7.4 g, 77.1 mmol) were added, 14.8 g of the product was obtained in the same manner as in Sub6-1. (Yield 74%)

3. Synthesis example of Sub6-19

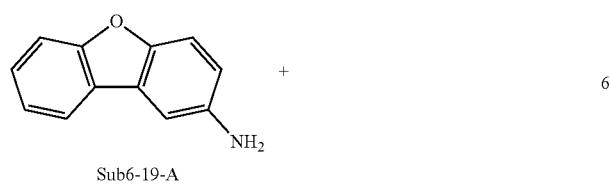

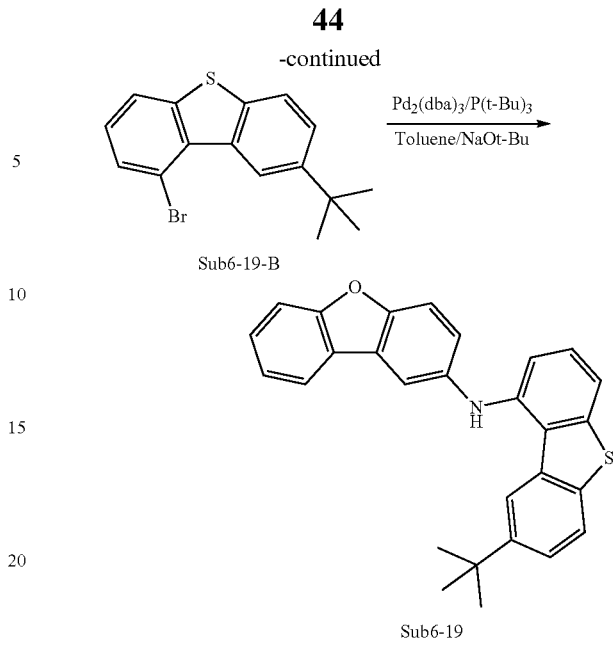

Sub6-19-A (10.0 g, 54.6 mmol) was dissolved in toluene (273 mL) in a round bottom flask, Sub6-19-B (17.4 g, 54.6 mmol), Pd$_2$(dba)$_3$ (1.50 g, 1.64 mmol), P(t-Bu)$_3$ (0.66 g, 3.27 mmol), NaOt-Bu (10.5 g, 109 mmol) were added, 17.5 g of the product was obtained in the same manner as in Sub6-1. (Yield 76%)

4. Synthesis example of Sub6-44

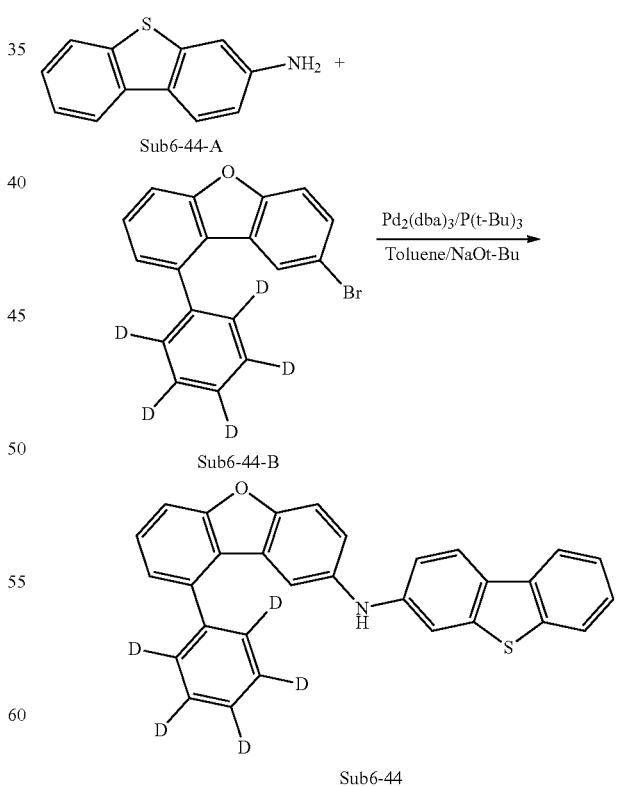

Sub6-44-A (10.0 g, 50.2 mmol) was dissolved in toluene (251 mL) in a round bottom flask, Sub6-44-B (16.5 g, 50.2 mmol), Pd$_2$(dba)$_3$ (1.38 g, 1.51 mmol), P(t-Bu)$_3$ (0.61 g, 3.01 mmol), NaOt-Bu (9.6 g, 100 mmol) were added, 17.3 g of the product was obtained in the same manner as in Sub6-1. (Yield 77%)

5. Synthesis example of Sub6-60

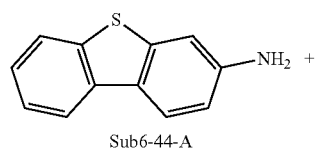
Sub6-44-A

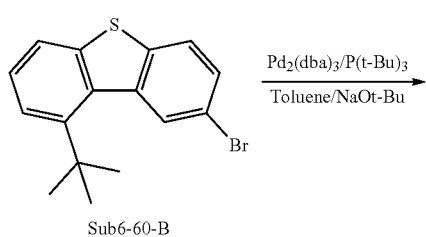
Sub6-60-B

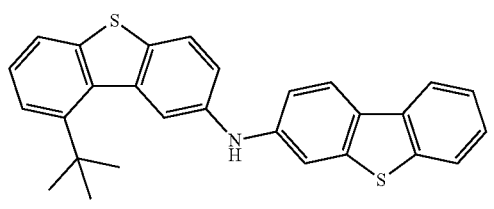
Sub6-60

Sub6-44-A (10.0 g, 50.2 mmol) was dissolved in toluene (251 mL) in a round bottom flask, Sub6-60-B (16.0 g, 50.2 mmol), Pd$_2$(dba)$_3$ (1.38 g, 1.51 mmol), P(t-Bu)$_3$ (0.61 g, 3.01 mmol), NaOt-Bu (9.6 g, 100 mmol) were added, 17.6 g of the product was obtained in the same manner as in Sub6-1. (Yield 80%)

Compounds belonging to Sub6 may be the following compounds, but are not limited thereto, and Table 2 shows FD-MS values of compounds belonging to Sub6.

Sub6-1

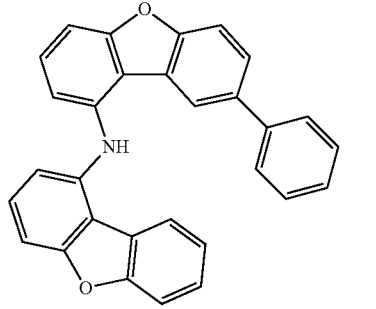

Sub6-2

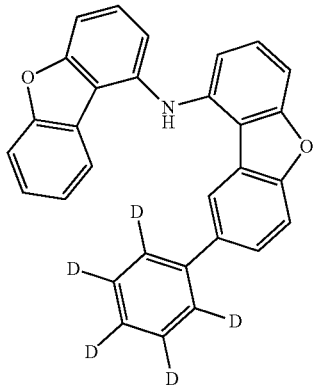

Sub6-3

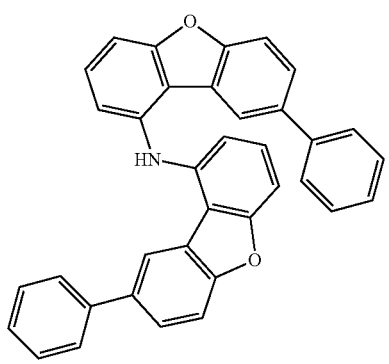

Sub6-4

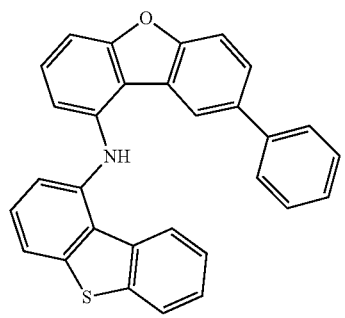

Sub6-5

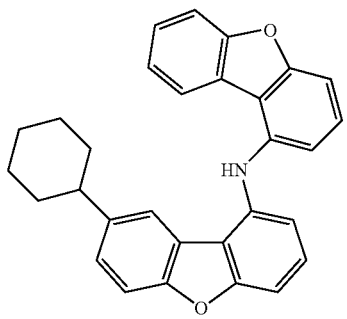

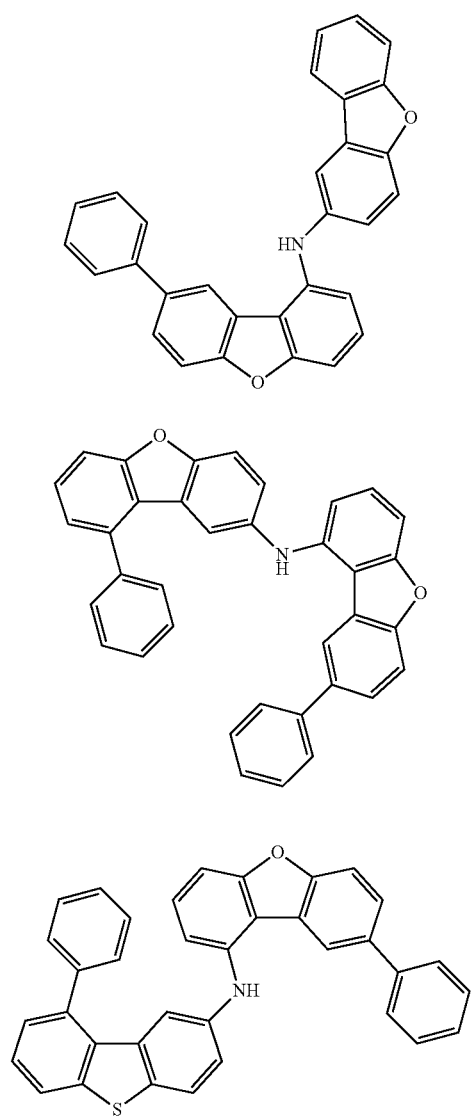
Sub6-6
Sub6-7
Sub6-8
Sub6-9
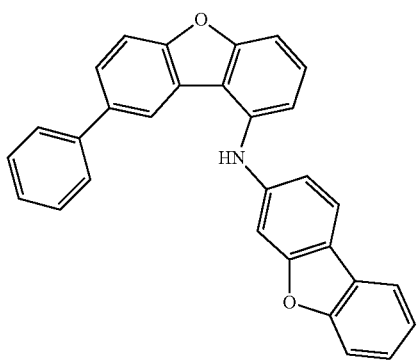
Sub6-10
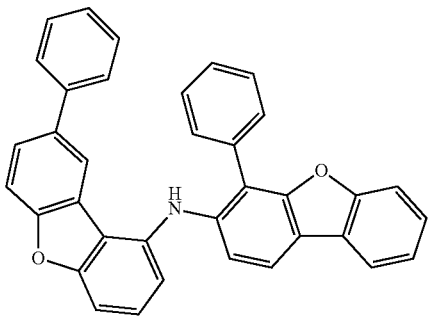
Sub6-11
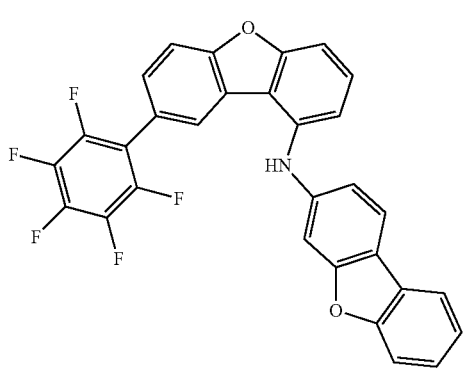
Sub6-12
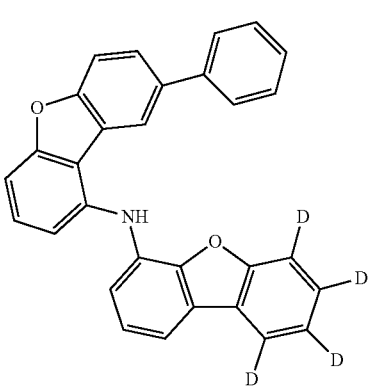
Sub6-13

Sub6-14
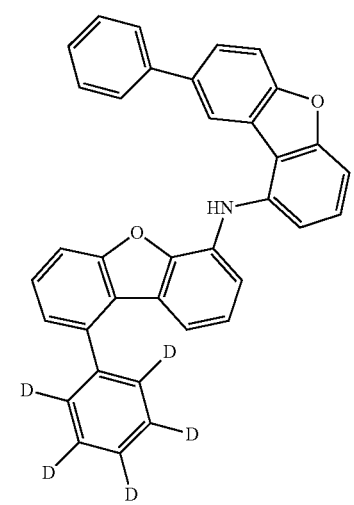
Sub6-15
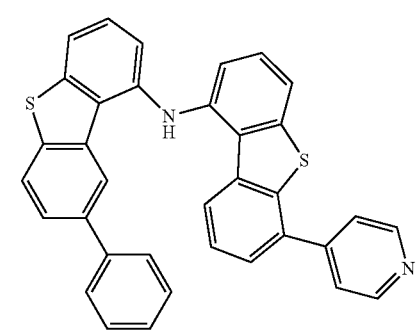
Sub6-16
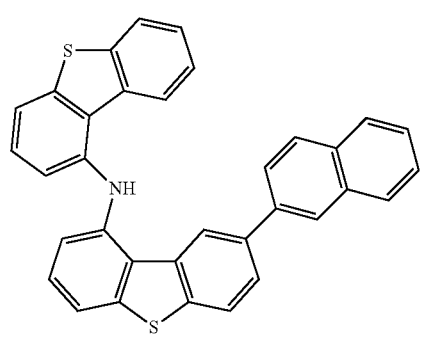
Sub-6-17
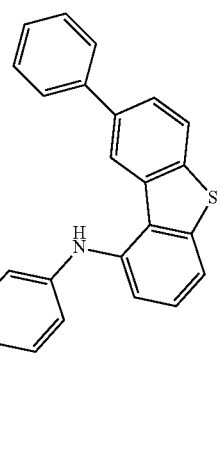
Sub6-18
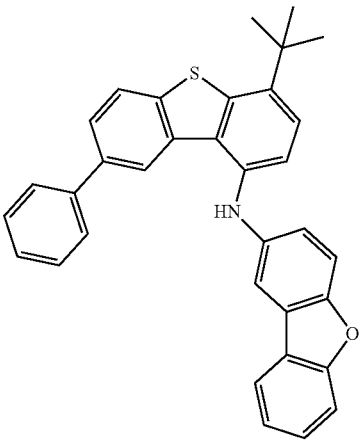
Sub6-19
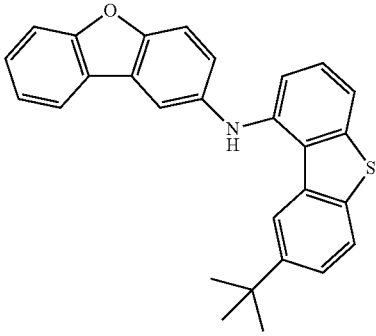
Sub6-30
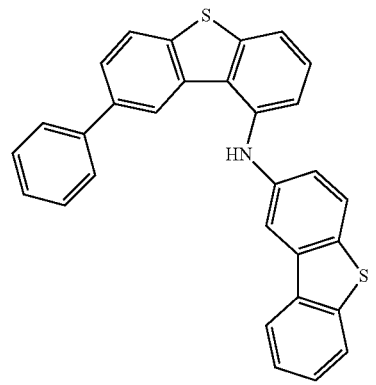
Sub6-21

-continued
Sub6-22
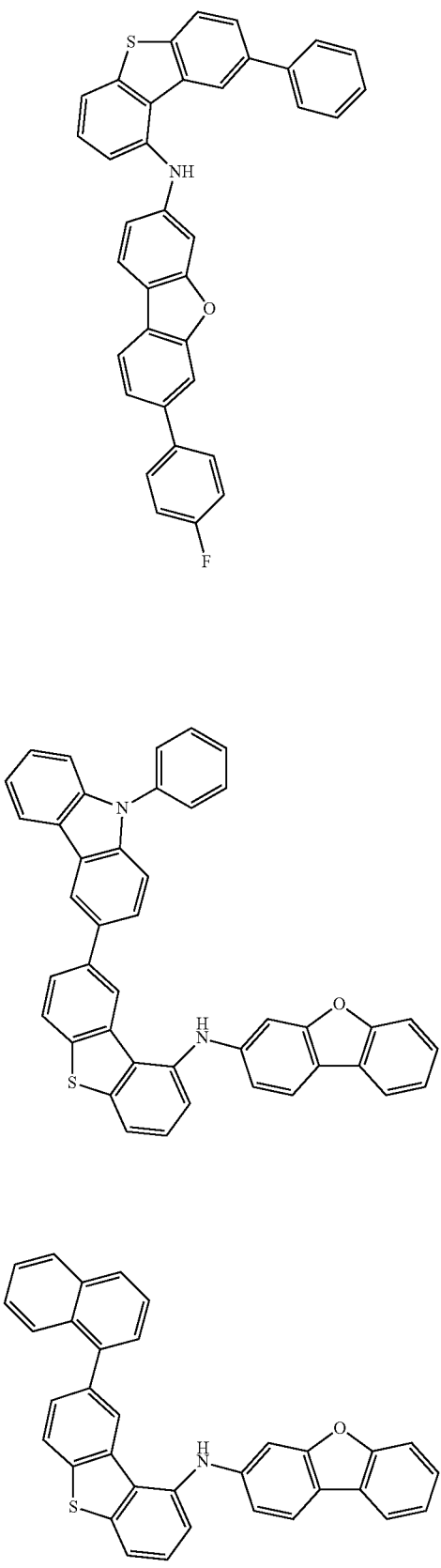
Sub6-23
Sub6-24
Sub6-25
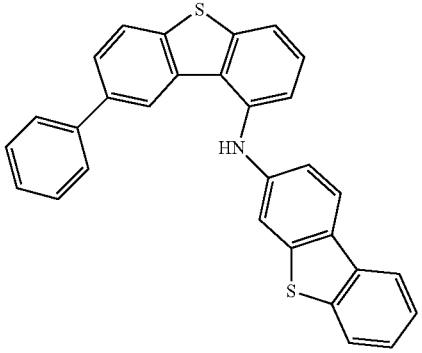
Sub6-26
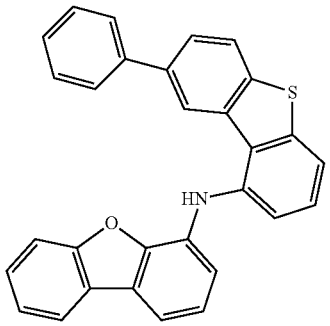
Sub6-27
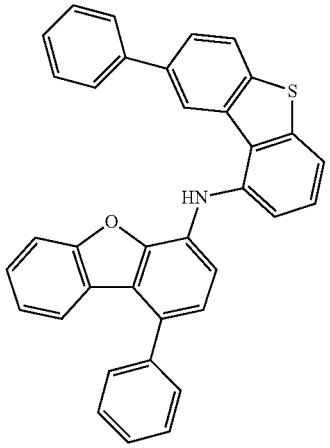
Sub6-28
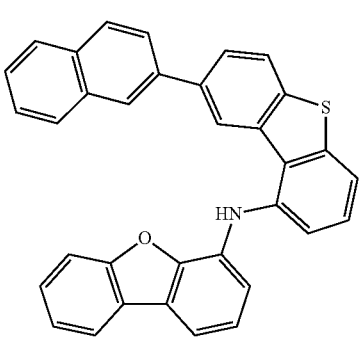

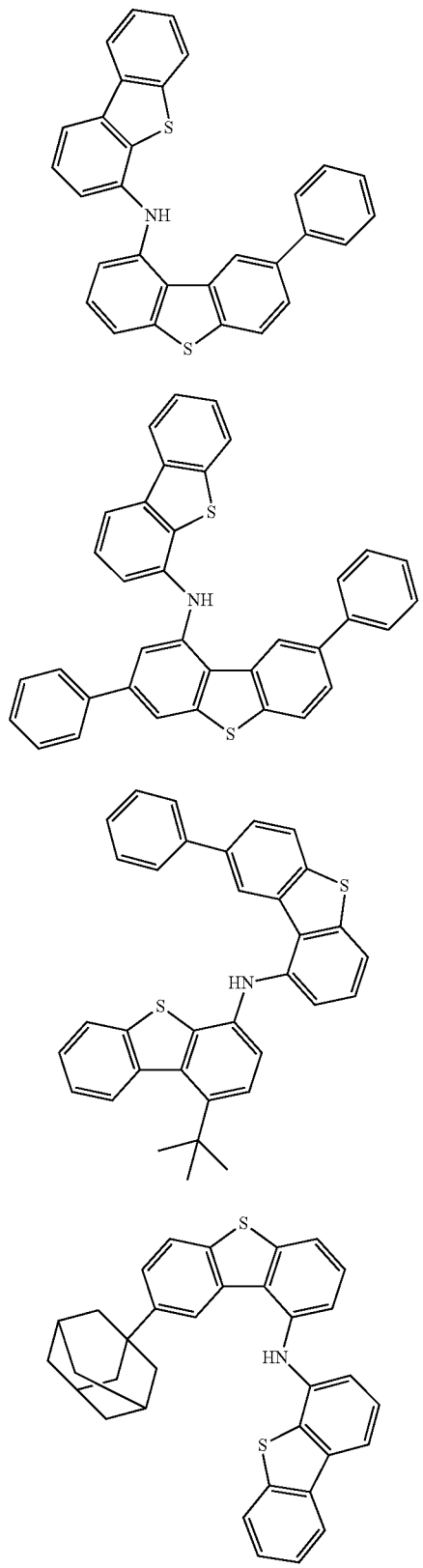
Sub6-29
Sub6-30
Sub6-31
Sub6-32
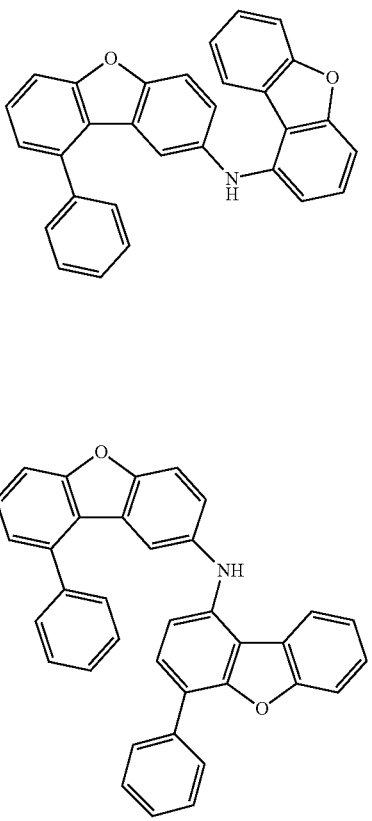
Sub6-33
Sub6-34
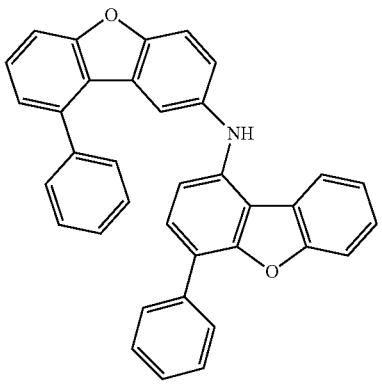
Sub6-35
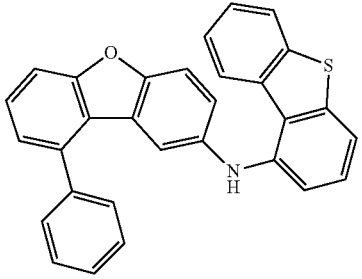
Sub6-36
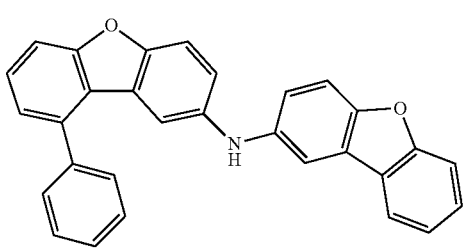

Sub6-37
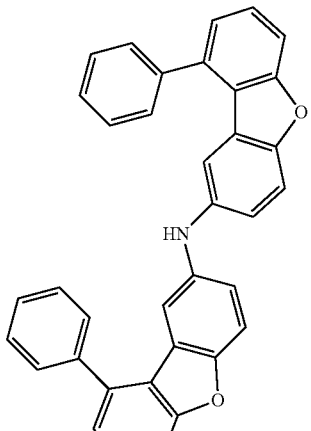
Sub6-38
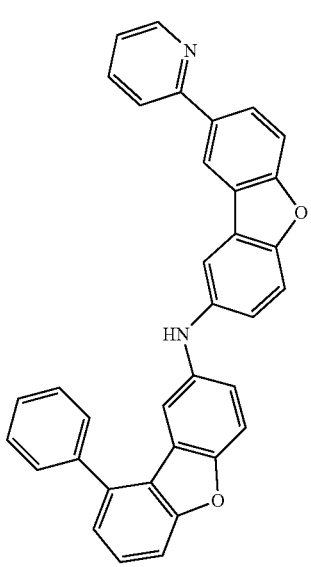
Sub6-39
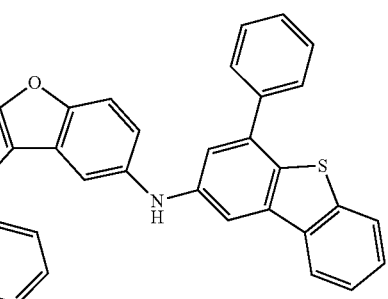
Sub6-40
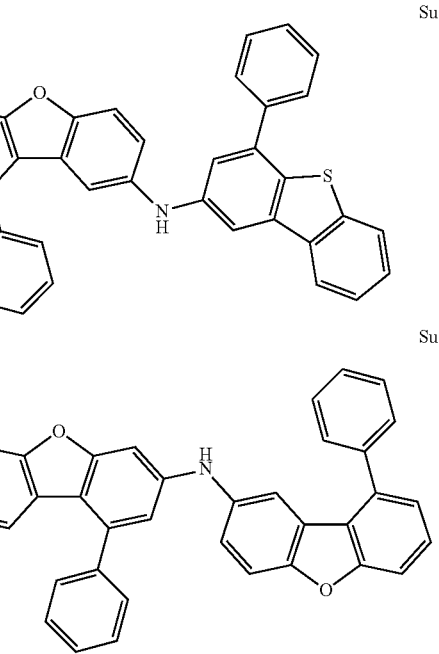
Sub6-41
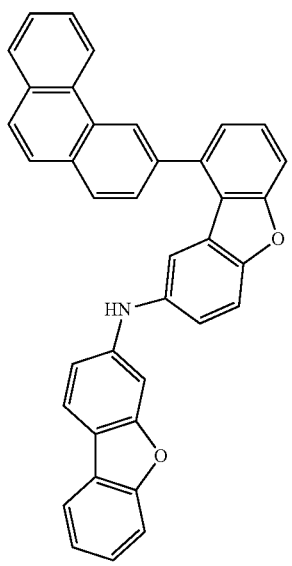
Sub6-42
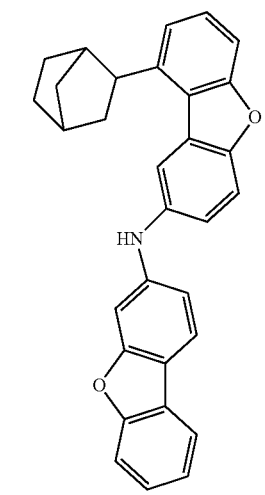
Sub6-43
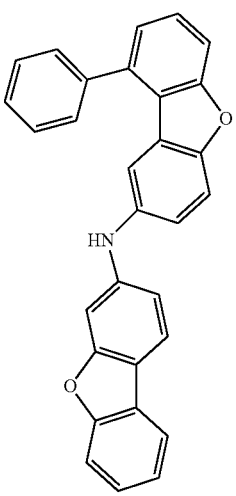

-continued
Sub6-44
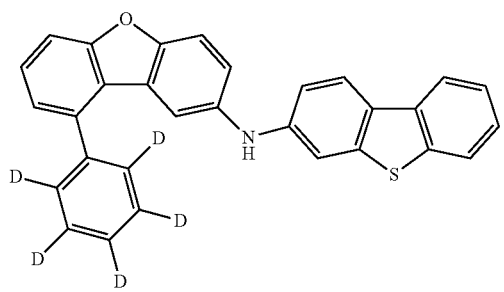
Sub6-45
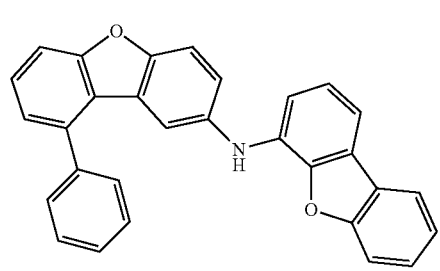
Sub6-46
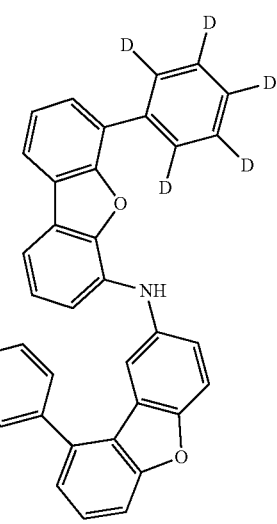
Sub6-47
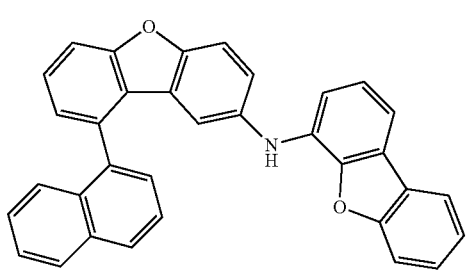
Sub6-48
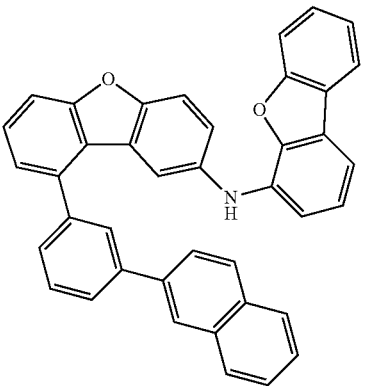
Sub6-49
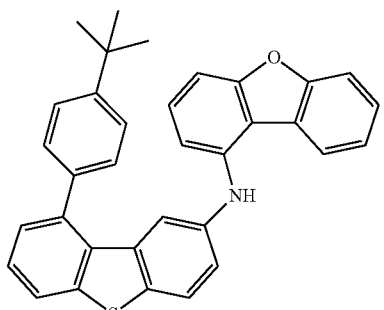
Sub6-50
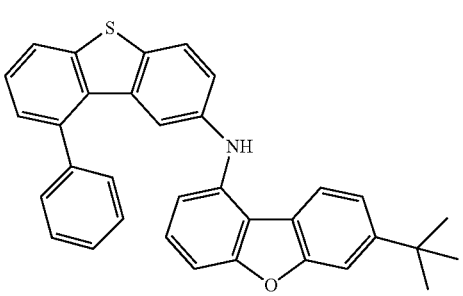
Sub6-51
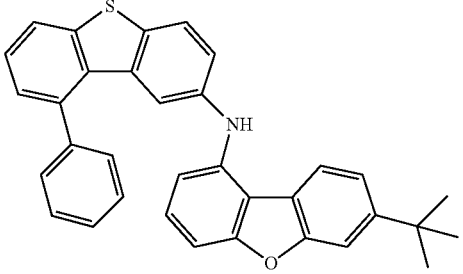
Sub6-52
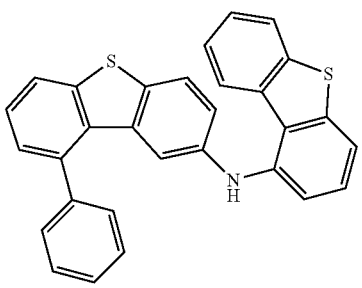

Sub6-53
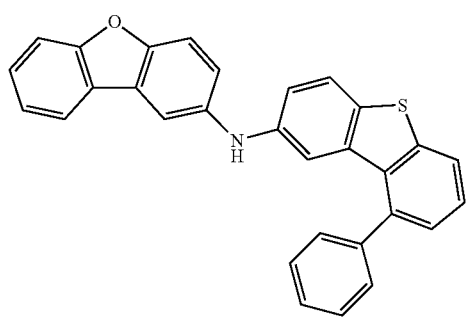
Sub6-54
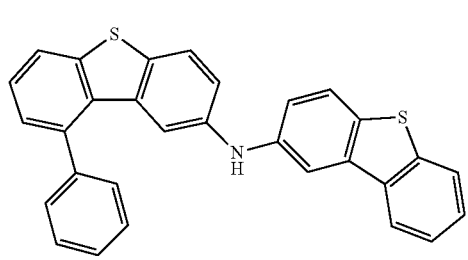
Sub6-55
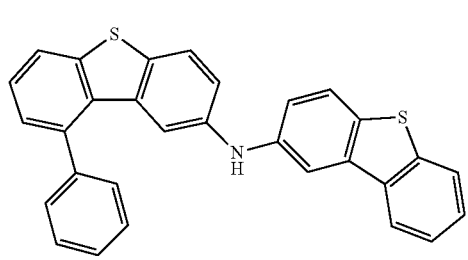
Sub6-56
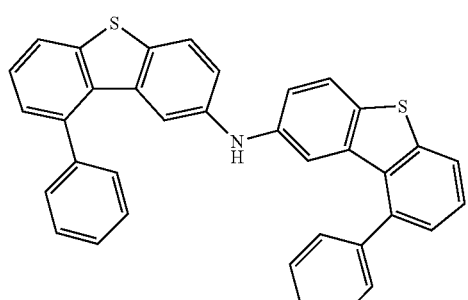
Sub6-57
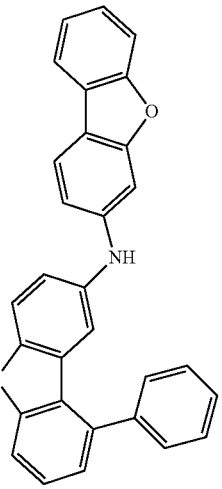
Sub6-58
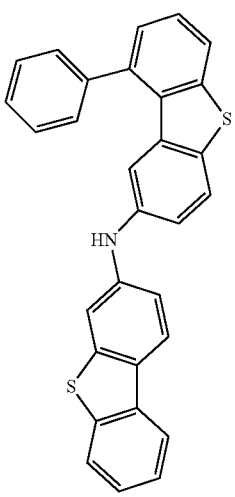
Sub6-59
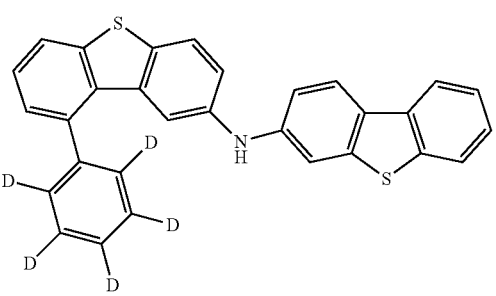
Sub6-60
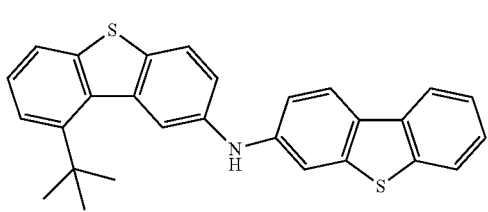

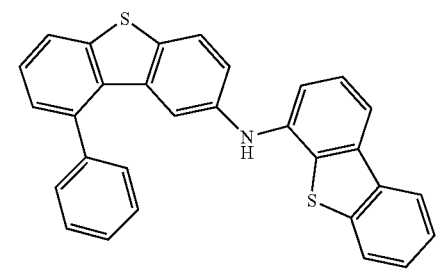

Sub6-61

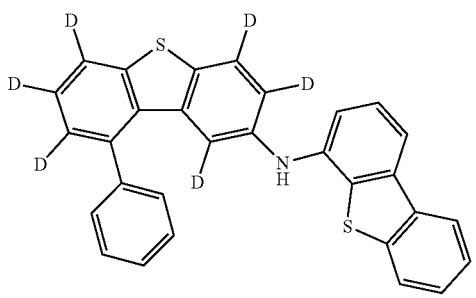

Sub6-62

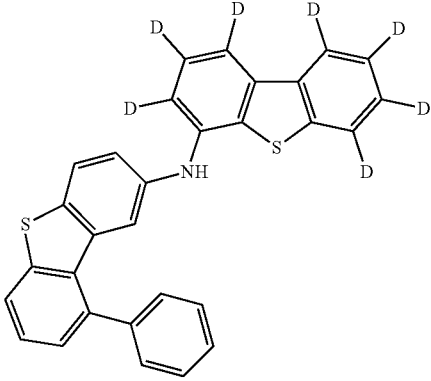

Sub6-63

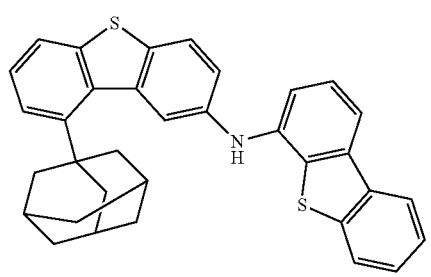

Sub6-64

TABLE 2

| compound | FD-MS | compound | FD-MS |
| --- | --- | --- | --- |
| Sub6-1 | m/z = 425.14($C_{30}H_{19}NO_2$ = 425.49) | Sub6-2 | m/z = 430.17($C_{30}H_{14}D_5NO_2$ = 430.52) |
| Sub6-3 | m/z = 501.17($C_{36}H_{23}NO_2$ = 501.58) | Sub6-4 | m/z = 441.12($C_{30}H_{19}NOS$ = 441.55) |
| Sub6-5 | m/z = 431.19($C_{30}H_{25}NO_2$ = 431.53) | Sub6-6 | m/z = 425.14($C_{30}H_{19}NO_2$ = 425.49) |
| Sub6-7 | m/z = 501.17($C_{36}H_{23}NO_2$ = 501.58) | Sub6-8 | m/z = 517.15($C_{36}H_{23}NOS$ = 517.65) |
| Sub6-9 | m/z = 421.15($C_{28}H_{23}NOS$ = 421.56) | Sub6-10 | m/z = 425.14($C_{30}H_{19}NO_2$ = 425.49) |
| Sub6-11 | m/z = 501.17($C_{36}H_{23}NO_2$ = 501.58) | Sub6-12 | m/z = 515.09($C_{30}H_{14}F_5NO_2$ = 515.44) |
| Sub6-13 | m/z = 429.17($C_{30}H_{15}D_4NO_2$ = 429.51) | Sub6-14 | m/z = 506.2($C_{36}H_{18}D_5NO_2$ = 506.62) |
| Sub6-15 | m/z = 517.15($C_{36}H_{23}NOS$ = 517.65) | Sub6-16 | m/z = 534.12($C_{35}H_{22}N_2S_2$ = 534.69) |
| Sub6-17 | m/z = 507.11($C_{34}H_{21}NS_2$ = 507.67) | Sub6-18 | m/z = 497.18($C_{34}H_{27}NOS$ = 497.66) |
| Sub6-19 | m/z = 421.15($C_{28}H_{23}NOS$ = 421.56) | Sub6-20 | m/z = 457.1($C_{30}H_{19}NS_2$ = 457.61) |
| Sub6-21 | m/z = 533.13($C_{36}H_{23}NS_2$ = 533.71) | Sub6-22 | m/z = 535.14($C_{36}H_{22}FNOS$ = 535.64) |
| Sub6-23 | m/z = 606.18($C_{42}H_{26}N_2OS$ = 606.74) | Sub6-24 | m/z = 491.13($C_{34}H_{21}NOS$ = 491.61) |
| Sub6-25 | m/z = 457.1($C_{30}H_{19}NS_2$ = 457.61) | Sub6-26 | m/z = 441.12($C_{30}H_{19}NOS$ = 441.55) |
| Sub6-27 | m/z = 517.15($C_{36}H_{23}NOS$ = 517.65) | Sub6-28 | m/z = 491.13($C_{34}H_{21}NOS$ = 491.61) |
| Sub6-29 | m/z = 457.1($C_{30}H_{19}NS_2$ = 457.61) | Sub6-30 | m/z = 533.13($C_{36}H_{23}NS_2$ = 533.71) |
| Sub6-31 | m/z = 513.16($C_{34}H_{27}NS_2$ = 513.72) | Sub6-32 | m/z = 515.17($C_{34}H_{29}NS_2$ = 515.73) |
| Sub6-33 | m/z = 425.14($C_{30}H_{19}NO_2$ = 425.49) | Sub6-34 | m/z = 501.17($C_{36}H_{23}NO_2$ = 501.58) |
| Sub6-35 | m/z = 441.12($C_{30}H_{19}NOS$ = 441.55) | Sub6-36 | m/z = 425.14($C_{30}H_{19}NO_2$ = 425.49) |
| Sub6-37 | m/z = 501.17($C_{36}H_{23}NO_2$ = 501.58) | Sub6-38 | m/z = 502.17($C_{35}H_{22}N_2O_2$ = 502.57) |
| Sub6-39 | m/z = 517.15($C_{36}H_{23}NOS$ = 517.65) | Sub6-40 | m/z = 501.17($C_{36}H_{23}NO_2$ = 501.58) |
| Sub6-41 | m/z = 525.17($C_{38}H_{23}NO_2$ = 525.61) | Sub6-42 | m/z = 443.19($C_{31}H_{25}NO_2$ = 443.55) |
| Sub6-43 | m/z = 441.12($C_{30}H_{19}NOS$ = 441.55) | Sub6-44 | m/z = 425.14($C_{30}H_{19}NO_2$ = 425.49) |
| Sub6-45 | m/z = 446.15($C_{30}H_{14}D_5NOS$ = 446.58) | Sub6-46 | m/z = 506.2($C_{36}H_{18}D_5NO_2$ = 506.62) |
| Sub6-47 | m/z = 475.16($C_{34}H_{21}NO_2$ = 475.55) | Sub6-48 | m/z = 551.19($C_{40}H_{25}NO_2$ = 551.64) |
| Sub6-49 | m/z = 497.18($C_{34}H_{27}NOS$ = 497.66) | Sub6-50 | m/z = 497.18($C_{34}H_{27}NOS$ = 497.66) |
| Sub6-51 | m/z = 457.1($C_{30}H_{19}NS_2$ = 457.61) | Sub6-52 | m/z = 533.13($C_{36}H_{23}NS_2$ = 533.71) |
| Sub6-53 | m/z = 441.12($C_{30}H_{19}NOS$ = 441.55) | Sub6-54 | m/z = 457.1($C_{30}H_{19}NS_2$ = 457.61) |
| Sub6-55 | m/z = 533.13($C_{36}H_{23}NS_2$ = 533.71) | Sub6-56 | m/z = 474.13($C_{31}H_{18}D_3NS_2$ = 474.65) |
| Sub6-57 | m/z = 441.12($C_{30}H_{19}NOS$ = 441.55) | Sub6-58 | m/z = 457.1($C_{30}H_{19}NS_2$ = 457.61) |
| Sub6-59 | m/z = 462.13($C_{30}H_{14}D_5NS_2$ = 462.64) | Sub6-60 | m/z = 437.13($C_{28}H_{23}NS_2$ = 437.62) |
| Sub6-61 | m/z = 457.1($C_{30}H_{19}NS_2$ = 457.61) | Sub6-62 | m/z = 463.13($C_{30}H_{13}D_6NS_2$ = 463.65) |
| Sub6-63 | m/z = 464.14($C_{30}H_{12}D_7NS_2$ = 464.65) | Sub6-64 | m/z = 515.17($C_{34}H_{29}NS_2$ = 515.73) |

III. Synthesis of Final Product

1. Synthesis example of P3-1

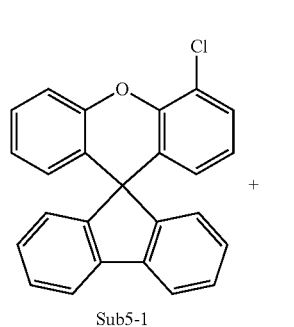

Sub5-1

+

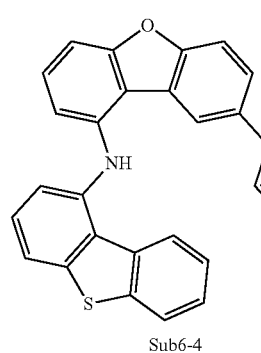

Sub6-4

→ Pd₂(dba)₃/P(t-Bu)₃ / Toluene/NaOt-Bu

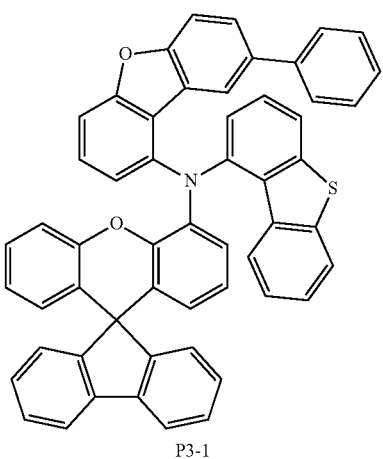

P3-1

After dissolving Sub5-1 (8.0 g, 21.8 mmol) with Toluene (109 mL) in a round bottom flask, Sub6-4 (9.6 g, 21.8 mmol), Pd₂(dba)₃ (0.60 g, 0.65 mmol), P(t-Bu)₃ (0.26 g, 1.31 mmol), NaOt-Bu (4.2 g, 43.6 mmol) were added and reacted at 80° C. when the reaction was complete, the mixture was extracted with $CH_2C_{12}$ and water, the organic layer was dried over MgSO₄, concentrated, and the resulting compound was purified by silicagel column and sublimation to obtain 12.1 g (yield: 72%) of the product.

2. Synthesis example of P3-13

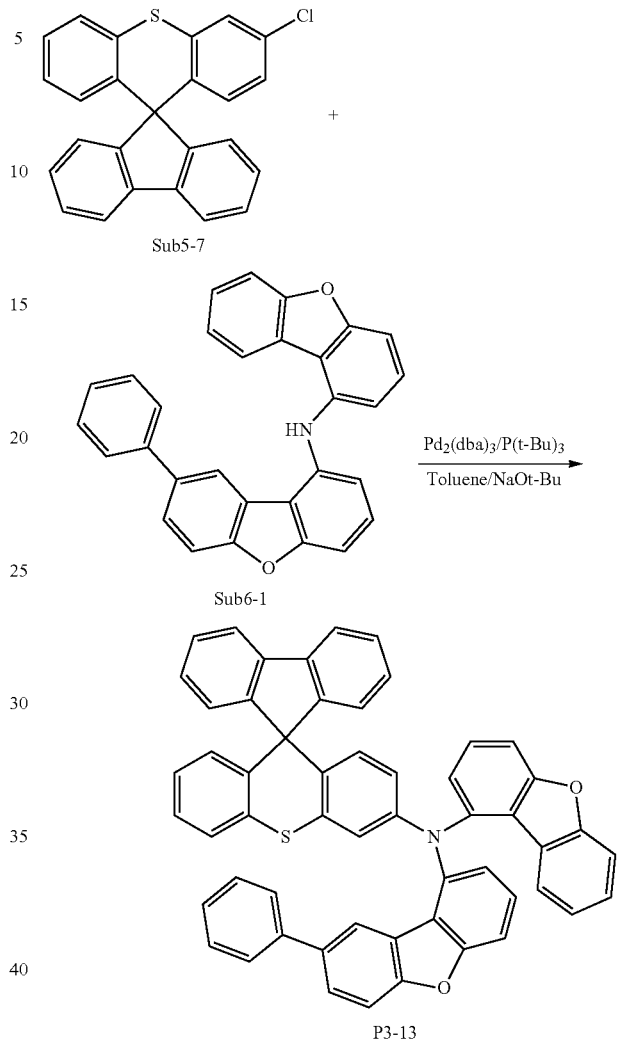

After dissolving Sub5-7 (8.0 g, 20.9 mmol) with Toluene (104 mL) in a round bottom flask, Sub6-1 (8.9 g, 20.9 mmol), Pd₂(dba)₃ (0.57 g, 0.63 mmol), P(t-Bu)₃ (0.25 g, 1.25 mmol), NaOt-Bu (4.0 g, 41.8 mmol) were used for the synthesis of P3-1 to obtain 12.1 g (yield: 75%) of the product.

3. Synthesis example of P3-21

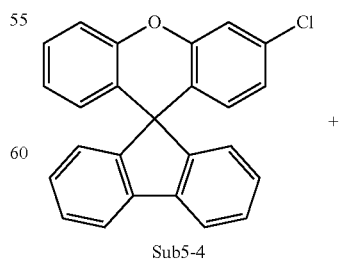

Sub5-4

+

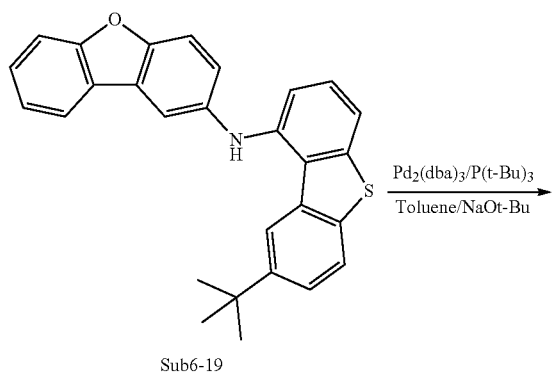

Sub6-19

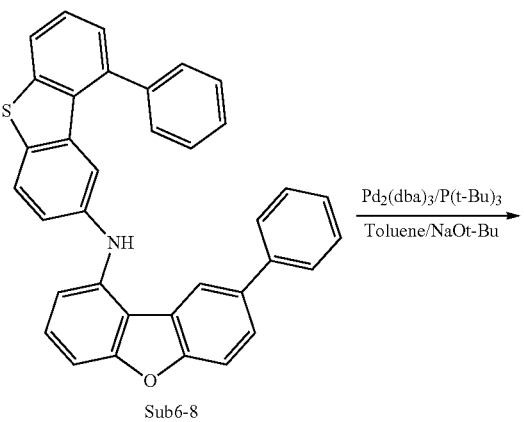

Sub6-8

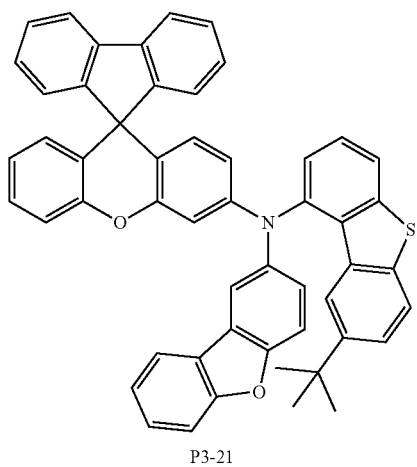

P3-21

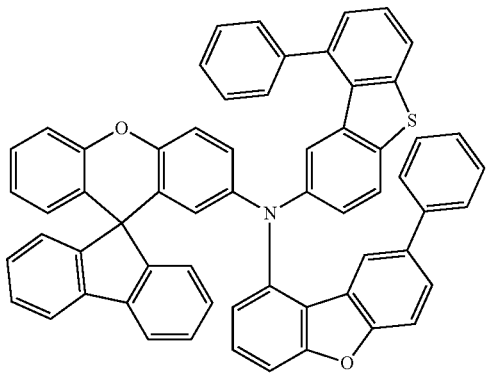

P3-28

After dissolving Sub5-4 (8.0 g, 21.8 mmol) with Toluene (109 mL) in a round bottom flask, Sub6-19 (9.2 g, 21.8 mmol), Pd$_2$(dba)$_3$ (0.60 g, 0.65 mmol), P(t-Bu)$_3$ (0.26 g, 1.31 mmol), NaOt-Bu (4.2 g, 43.6 mmol) were used for the synthesis of P3-1 to obtain 12.5 g (yield: 76%) of the product.

4. Synthesis example of P3-28

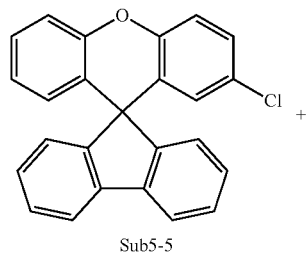

Sub5-5

After dissolving Sub5-5 (8.0 g, 21.8 mmol) with Toluene (109 mL) in a round bottom flask, Sub6-8 (11.3 g, 21.8 mmol), Pd$_2$(dba)$_3$ (0.60 g, 0.65 mmol), P(t-Bu)$_3$ (0.26 g, 1.31 mmol), NaOt-Bu (4.2 g, 43.6 mmol) were used for the synthesis of P3-1 to obtain 13.1 g (yield: 71%) of the product.

5. Synthesis example of P3-56

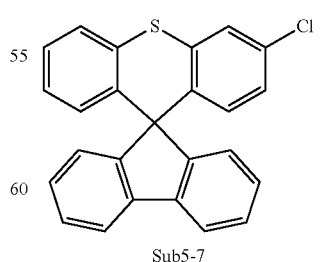

Sub5-7

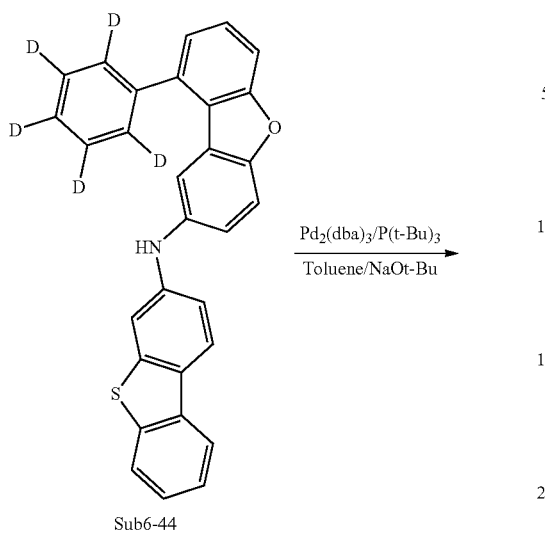

Sub6-44

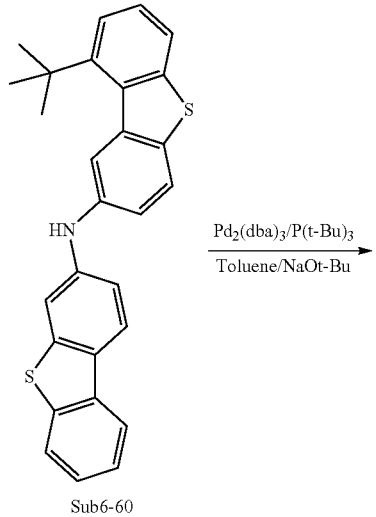

Sub6-60

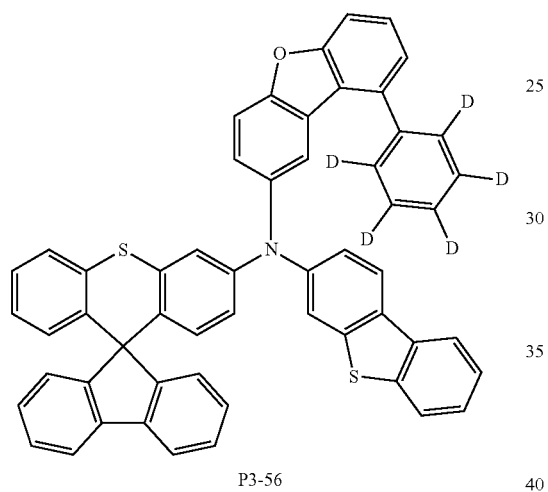

P3-56

After dissolving Sub5-10 (8.0 g, 20.9 mmol) with Toluene (104 mL) in a round bottom flask, Sub6-60 (9.1 g, 20.9 mmol), Pd$_2$(dba)$_3$ (0.57 g, 0.63 mmol), P(t-Bu)$_3$ (0.25 g, 1.25 mmol), NaOt-Bu (4.0 g, 41.8 mmol) were used for the synthesis of P3-1 to obtain 12.3 g (yield: 74%) of the product.

6. Synthesis example of P3-67

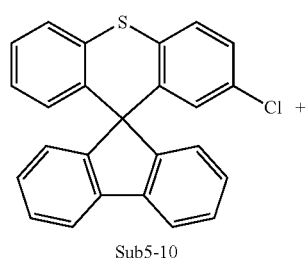

Sub5-10

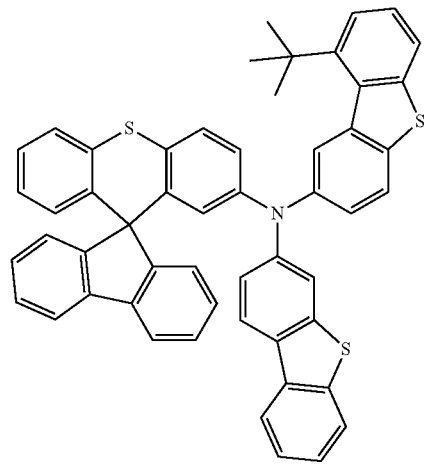

P3-67

After dissolving Sub5-10 (8.0 g, 20.9 mmol) with Toluene (104 mL) in a round bottom flask, Sub6-60 (9.1 g, 20.9 mmol), Pd$_2$(dba)$_3$ (0.57 g, 0.63 mmol), P(t-Bu)$_3$ (0.25 g, 1.25 mmol), NaOt-Bu (4.0 g, 41.8 mmol) were used for the synthesis of P3-1 to obtain 12.8 g (yield: 78%) of the product.

Meanwhile, the FD-MS values of the compounds P3-1 to P3-72 of the present invention prepared according to the Synthesis Example as described above are shown in Table 3.

TABLE 3

| compound | FD-MS | compound | FD-MS |
|---|---|---|---|
| P3-1 | m/z = 771.22($C_{55}H_{33}NO_2S$ = 771.93) | P3-2 | m/z = 847.25($C_{61}H_{37}NO_2S$ = 848.03) |
| P3-3 | m/z = 880.2($C_{60}H_{36}N_2S_3$ = 881.14) | P3-4 | m/z = 787.2($C_{55}H_{33}NOS_2$ = 787.99) |
| P3-5 | m/z = 879.21($C_{61}H_{37}NS_3$ = 880.15) | P3-6 | m/z = 831.28($C_{61}H_{37}NO_3$ = 831.97) |
| P3-7 | m/z = 803.18($C_{55}H_{33}NS_3$ = 804.06) | P3-8 | m/z = 847.25($C_{61}H_{37}NO_2S$ = 848.03) |
| P3-9 | m/z = 861.18($C_{55}H_{28}F_5NO_2S$ = 861.89) | P3-10 | m/z = 771.22($C_{55}H_{33}NO_2S$ = 771.93) |
| P3-11 | m/z = 759.27($C_{55}H_{29}D_4NO_3$ = 759.9) | P3-12 | m/z = 836.31($C_{61}H_{32}D_5NO_3$ = 837) |
| P3-13 | m/z = 771.22($C_{55}H_{33}NO_2S$ = 771.93) | P3-14 | m/z = 760.28($C_{55}H_{28}D_5NO_3$ = 760.9) |
| P3-15 | m/z = 821.24($C_{59}H_{35}NO_2S$ = 821.99) | P3-16 | m/z = 831.28($C_{61}H_{37}NO_3$ = 831.97) |
| P3-17 | m/z = 843.26($C_{59}H_{41}NOS_2$ = 844.1) | P3-18 | m/z = 952.26($C_{67}H_{40}N_2OS_2$ = 953.19) |
| P3-19 | m/z = 803.18($C_{55}H_{33}NS_3$ = 804.06) | P3-20 | m/z = 865.25($C_{61}H_{36}FNO_2S$ = 866.02) |
| P3-21 | m/z = 751.25($C_{53}H_{37}NO_2S$ = 751.94) | P3-22 | m/z = 847.25($C_{61}H_{37}NO_2S$ = 848.03) |
| P3-23 | m/z = 859.24($C_{59}H_{41}NS_3$ = 860.16) | P3-24 | m/z = 761.29($C_{55}H_{39}NO_3$ = 761.92) |
| P3-25 | m/z = 755.25($C_{55}H_{33}NO_3$ = 755.87) | P3-26 | m/z = 831.28($C_{61}H_{37}NO_3$ = 831.97) |
| P3-27 | m/z = 853.19($C_{59}H_{35}NS_3$ = 854.12) | P3-28 | m/z = 847.25($C_{61}H_{37}NO_2S$ = 848.03) |
| P3-29 | m/z = 787.2($C_{55}H_{33}NOS_2$ = 787.99) | P3-30 | m/z = 767.23($C_{53}H_{37}NOS_2$ = 768) |
| P3-31 | m/z = 771.22($C_{55}H_{33}NO_2S$ = 771.93) | P3-32 | m/z = 847.25($C_{61}H_{37}NO_2S$ = 848.03) |
| P3-33 | m/z = 821.24($C_{59}H_{35}NO_2S$ = 821.99) | P3-34 | m/z = 803.18($C_{55}H_{33}NS_3$ = 804.06) |
| P3-35 | m/z = 879.21($C_{61}H_{37}NS_3$ = 880.15) | P3-36 | m/z = 845.28($C_{59}H_{43}NOS_2$ = 846.12) |
| P3-37 | m/z = 787.2($C_{55}H_{33}NOS_2$ = 787.99) | P3-38 | m/z = 827.29($C_{59}H_{41}NO_2S$ = 828.04) |
| P3-39 | m/z = 831.28($C_{61}H_{37}NO_3$ = 831.97) | P3-40 | m/z = 787.2($C_{55}H_{33}NOS_2$ = 787.99) |
| P3-41 | m/z = 831.28($C_{61}H_{37}NO_3$ = 831.97) | P3-42 | m/z = 804.23($C_{56}H_{32}D_3NOS_2$ = 805.04) |
| P3-43 | m/z = 787.2($C_{55}H_{33}NOS_2$ = 787.99) | P3-44 | m/z = 808.21($C_{55}H_{28}D_5NS_3$ = 809.09) |
| P3-45 | m/z = 831.28($C_{61}H_{37}NO_3$ = 831.97) | P3-46 | m/z = 803.18($C_{55}H_{33}NS_3$ = 804.06) |
| P3-47 | m/z = 794.24($C_{55}H_{26}D_7NOS_2$ = 795.04) | P3-48 | m/z = 881.29($C_{65}H_{39}NO_3$ = 882.03) |
| P3-49 | m/z = 755.25($C_{55}H_{33}NO_3$ = 755.87) | P3-50 | m/z = 831.28($C_{61}H_{37}NO_3$ = 831.97) |
| P3-51 | m/z = 955.24($C_{67}H_{41}NS_3$ = 956.25) | P3-52 | m/z = 863.23($C_{61}H_{37}NOS_2$ = 864.09) |
| P3-53 | m/z = 863.23($C_{61}H_{37}NO_2S$ = 864.09) | P3-54 | m/z = 827.29($C_{59}H_{41}NO_2S$ = 828.04) |
| P3-55 | m/z = 773.29($C_{56}H_{39}NO_3$ = 773.93) | P3-56 | m/z = 792.23($C_{55}H_{28}D_5NOS_2$ = 793.03) |
| P3-57 | m/z = 787.2($C_{55}H_{33}NOS_2$ = 787.99) | P3-58 | m/z = 821.24($C_{59}H_{35}NO_2S$ = 821.99) |
| P3-59 | m/z = 809.22($C_{55}H_{27}D_6NS_3$ = 810.09) | P3-60 | m/z = 836.31($C_{61}H_{32}D_5NO_3$ = 837) |
| P3-61 | m/z = 787.2($C_{55}H_{33}NOS_2$ = 787.99) | P3-62 | m/z = 831.28($C_{61}H_{37}NO_3$ = 831.97) |
| P3-63 | m/z = 827.29($C_{59}H_{41}NO_2S$ = 828.04) | P3-64 | m/z = 803.18($C_{55}H_{33}NS_3$ = 804.06) |
| P3-65 | m/z = 831.28($C_{61}H_{37}NO_3$ = 831.97) | P3-66 | m/z = 848.25($C_{60}H_{36}N_2O_2S$ = 849.02) |
| P3-67 | m/z = 783.21($C_{53}H_{37}NS_3$ = 784.07) | P3-68 | m/z = 787.2($C_{55}H_{33}NOS_2$ = 787.99) |
| P3-69 | m/z = 855.28($C_{63}H_{37}NO_3$ = 855.99) | P3-70 | m/z = 771.22($C_{55}H_{33}NO_2S$ = 771.93) |
| P3-71 | m/z = 787.2($C_{55}H_{33}NOS_2$ = 787.99) | P3-72 | m/z = 861.26($C_{59}H_{43}NS_3$ = 862.18) |

Otherwise, the synthesis examples of the present invention represented by the Formula 7 have been described, but these are all based on the Buchwald-Hartwig cross coupling reaction, Miyaura boration reaction, Suzuki cross-coupling reaction, Intramolecular acid-induced cyclization reaction (J. mater. Chem.1999, 9, 2095.), Pd(II)-catalyzed oxidative cyclization reaction (*Org. Lett.*2011, 13, 5504), and PPh3-mediated reductive cyclization reaction (I *Org. Chem.* 2005, 70, 5014.), and those skilled in the art will easily understand that the reaction proceeds even when other substituents defined in Formula 7 are bonded in addition to the substituents specified in the specific synthesis examples.

Manufacturing evaluation of organic electronic elements

[Example 48] Green organic light emitting device (emitting auxiliary layer)

After vacuum depositing $N^1$-(naphthalen-2-yl)-$N^4$,$N^4$-bis (4-(naphthalen-2-yl(phenyl)amino)phenyl)-$N^1$-phenylbenzene-1,4-diamine (hereinafter abbreviated as 2-TNATA) on the ITO layer (anode) formed on the glass substrate to form a hole injection layer with a thickness of 60 nm, a hole transport layer was formed by vacuum depositing N,N'-bis (1-naphthalenyl)-N,N'-bis-phenyl-(1,1'-biphenyl)-4,4'-diamine (hereinafter abbreviated as NPB) to a thickness of 60 nm on the hole injection layer.

Then, the compound P3-1 of the present invention represented by Formula 7 was vacuum deposited on the hole transport layer to a thickness of 10 nm to form an emitting auxiliary layer. On the emitting auxiliary layer, 4,4'-N,N'-dicarbazole-biphenyl (hereinafter abbreviated as CBP) was used as a host material and tris(2-phenylpyridine)-iridium (hereinafter abbreviated as Ir(ppy)$_3$) as a dopant material, and doped at a weight ratio of 95:5, and vacuum deposited to a thickness of 30 nm to form an emitting layer. (1,1'-biphenyl-4-olato)bis(2-methyl-8-quinolinolato)aluminum (hereinafter abbreviated as Blaq) was vacuum deposited to a thickness of 10 nm to form a hole blocking layer, and on the hole blocking layer, tris-(8-hydroxyquinoline)aluminum (hereinafter abbreviated as Alq$_3$) was vacuum deposited to a thickness of 55 nm to form an electron transport layer. Thereafter, LiF, an alkali metal halide, was deposited to a thickness of 0.2 nm to form an electron injection layer, and then Al was deposited to a thickness of 150 nm to form a cathode, thereby manufacturing an organic light emitting device.

Example 49 to Example 61

An organic light emitting device was manufactured in the same manner as in Example 48, except that the compound of the present invention shown in Table 4 was used instead of the compound P3-1 of the present invention as a material for the emitting auxiliary layer.

Comparative Example 7 to Comparative Example 8

An organic light emitting device was manufactured in the same manner as in Example 48, except that Comparative Compound 5 or Comparative Compound 6 described in Table 4 was used instead of Compound P3-1 of the present invention as a material for the emitting auxiliary layer.

<comparative compound 5>

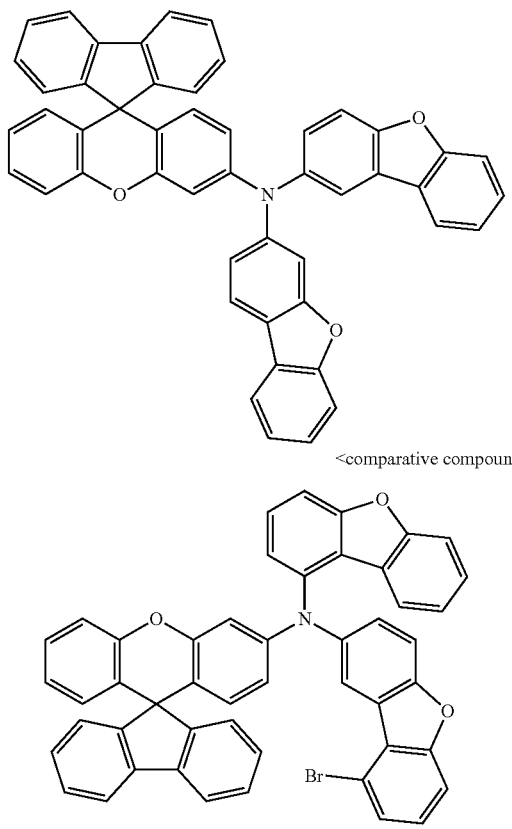

<comparative compound 6>

To the organic electroluminescent device manufactured by Examples 48 to 61, Comparative Example 7 and Comparative Example 8 of the present invention, Electroluminescence (EL) characteristics were measured with a PR-650 of Photoresearch Co., by applying a forward bias DC voltage. As a result of the measurement, T95 life was measured at a standard luminance of 5,000 cd/m² through life measuring apparatus manufactured by McScience. Table 4 shows the results of device fabrication and evaluation.

This measurement device is unaffected by possible daily fluctuations in deposition rate, vacuum quality or other parameters, and can evaluate the performance of a new material compared to a comparative compound under the same conditions.

At the time of evaluation, since one batch contains 4 identically prepared OLEDs including the comparative compound, and Since the performance of a total of 12 OLEDs is evaluated in 3 batches, the value of the experimental results thus obtained shows statistical significance.

TABLE 4

| | compound | Voltage | Current Density (mA/cm²) | Efficiency (cd/A) | T(95) |
|---|---|---|---|---|---|
| comparative example(7) | comparative compound 5 | 5.4 | 20.4 | 24.5 | 104.8 |
| comparative example(8) | comparative compound 6 | 5.3 | 18.7 | 30.6 | 108.7 |
| example(48) | compound(P3-1) | 5.2 | 11.8 | 42.5 | 139.3 |
| example(49) | compound(P3-6) | 5.3 | 11.3 | 44.1 | 139.1 |
| example(50) | compound(P3-11) | 5.3 | 11.9 | 42.0 | 132.5 |

TABLE 4-continued

| | compound | Voltage | Current Density (mA/cm²) | Efficiency (cd/A) | T(95) |
|---|---|---|---|---|---|
| example(51) | compound(P3-14) | 5.2 | 11.2 | 44.6 | 146.3 |
| example(52) | compound(P3-19) | 5.1 | 11.8 | 42.4 | 132.6 |
| example(53) | compound(P3-24) | 5.1 | 10.7 | 46.8 | 139.2 |
| example(54) | compound(P3-26) | 5.2 | 11.0 | 45.5 | 149.1 |
| example(55) | compound(P3-28) | 5.2 | 11.0 | 45.4 | 143.3 |
| example(56) | compound(P3-34) | 5.1 | 12.0 | 41.6 | 131.2 |
| example(57) | compound(P3-40) | 5.1 | 13.0 | 38.6 | 121.7 |
| example(58) | compound(P3-49) | 5.1 | 12.3 | 40.6 | 133.0 |
| example(59) | compound(P3-54) | 5.1 | 12.3 | 40.5 | 127.8 |
| example(60) | compound(P3-57) | 5.0 | 12.7 | 39.3 | 122.9 |
| example(61) | compound(P3-62) | 5.2 | 10.8 | 46.3 | 146.1 |

As can be seen from the results of Table 4, when a green organic light emitting device is manufactured using the material for an organic light emitting device of the present invention as an emitting auxiliary layer material, the luminous efficiency and lifetime of the organic light emitting device can be significantly improved, compared to Comparative Example using Comparative Compound 5 and Comparative Compound 6.

Comparing Comparative Compound 5 and Comparative Compound 6, both Comparative Compound 5 and Comparative Compound 6 have the same substituent of the amine group as dibenzofuran, but Comparative Compound 6 is different in that the halogen substituent is further substituted at a specific position, and additionally, the bonding position of dibenzofuran is also different. As a result, there is a difference in efficiency and lifespan.

Tables 5 and 6 are data obtained by measuring Comparative Compound 5, Comparative Compound 6, and Compound P3-49 of the present invention using the DFT Method (B3LYP/6-31 g(D)) of a Gaussian program.

TABLE 5

| | Comparative compound 5 | Comparative compound 6 | P3-49 |
|---|---|---|---|
| G.T1 (eV) | 2.755 | 2.899 | 2.898 |

As can be seen in Table 5, it can be seen that the T1 value of Comparative Compound 5 and Comparative Compound 6 or Compound P3-49 of the present invention is different. Triplet excitons of the emitting layer may pass to the emitting-auxiliary layer, and the light emitting efficiency decreases as the exciton to be converted into light energy is consumed as thermal energy in the emitting-auxiliary layer. In order to prevent this, a high T1 value is required. Compared to Comparative Compound 5, it can be seen that Comparative Compound 6 or Compound P3-49 of the present invention has higher luminous efficiency due to a higher T1 value.

TABLE 6

| | Comparative compound 6 | P3-49 |
|---|---|---|
| G.HOMO (eV) | 5.055 | 4.988 |

As shown in Table 6, it can be seen that the compound P3-49 of the present invention has a higher HOMO value than Comparative Compound 6. This means that hole injection is performed well, and it can be seen that the efficiency of the compound of the present invention increases and the lifespan increases as it can be quickly moved to the emitting layer (EML).

In addition, in the evaluation results of the above-described device fabrication, the device characteristics in which the compound of the present invention was applied only to the emitting-auxiliary layer were described, but the compound of the present invention may be applied to the hole transport layer or applied to both the hole transport layer and the emitting auxiliary layer.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the embodiment disclosed in the present invention is intended to illustrate the scope of the technical idea of the present invention, and the scope of the present invention is not limited by the embodiment. The scope of the present invention shall be construed on the basis of the accompanying claims, and it shall be construed that all of the technical ideas included within the scope equivalent to the claims belong to the present invention.

What is claimed is:

1. A compound represented by Formula 7-8 or Formula 7-9:

<Formula 7-8>

<Formula 7-9> wherein, $X^1$ and $X^3$ are each independently O or S, e, g, are each independently an integer of 0 to 4, f and n are each independently an integer of 0 to 3, and i is an integer of 1 to 4, $R^1$, $R^2$, $R^3$, $R^4$ and $Ar^3$ are the same or different from each other and are each independently selected from the group consisting of hydrogen; deuterium; $C_6$-$C_{12}$ aryl group; $C_1$-$C_{10}$ alkyl group, and $R^6$ is $C_6$-$C_{12}$ aryl group or $C_1$-$C_{10}$ alkyl group, A is a substituent represented by Formula A-1; or a substituent represented by Formula A-2;

<Formula A-1>

<Formula A-2> wherein, $X^{11}$ and $X^{12}$ are each independently O or S, $Ar^{11}$ and $Ar^{12}$ are each a $C_6$-$C_{12}$ aryl group or $C_1$-$C_{10}$ alkyl group, $R^{21}$, $R^{22}$, $R^{23}$ and $R^{24}$ are the same as the definition of $R^1$, w, x, y and z are each independently an integer of 0 to 3, wherein, the aryl group and alkyl group may be substituted with one or more substituents selected from the group consisting of deuterium; $C_6$-$C_{12}$ aryl group and $C_6$-$C_{12}$ aryl group substituted with deuterium.

2. The compound of claim 1 selected from the group consisting of the following compounds P3-26, P3-28, P3-62, P3-63 and P3-65:

P3-26

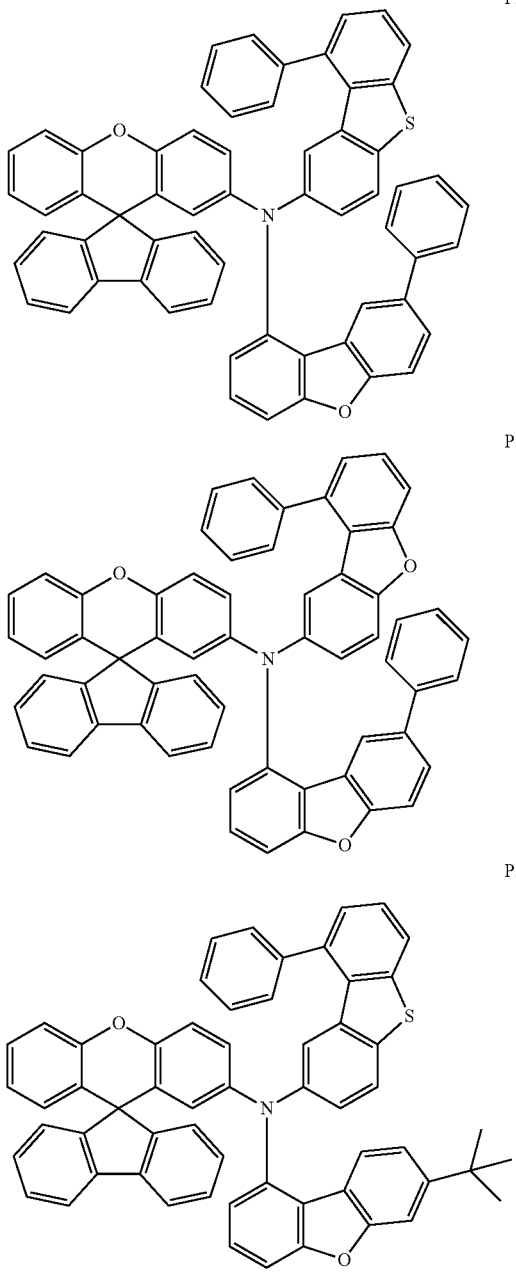
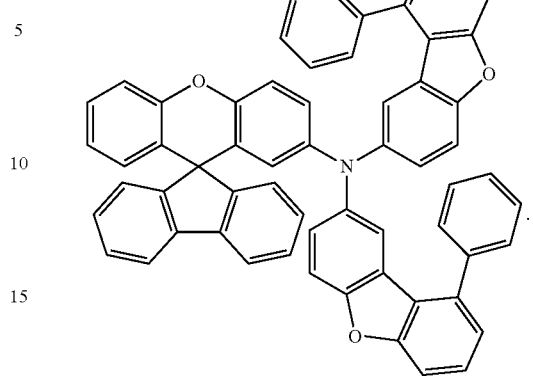

3. An organic electric element comprising an anode, a cathode, and an organic material layer formed between the anode and the cathode, wherein the organic material layer comprises a single compound or 2 or more compounds represented by Formula 7-8 or Formula 7-9 of claim 1.

4. The organic electric element of claim 3, wherein the organic material layer comprises at least one of a hole injection layer, a hole transport layer, an emitting auxiliary layer, an emitting layer, an electron transport auxiliary layer, electron transport layer and an electron injection layer.

5. The organic electric element of claim 3, wherein the organic material layer is an emitting auxiliary layer.

6. The organic electronic element of claim 3, further comprising a light efficiency enhancing layer formed on at least one surface of the anode and the cathode, the surface being opposite to the organic material layer.

7. The organic electronic element of claim 3, wherein the organic material layer comprises 2 or more stacks comprising a hole transport layer, an emitting layer, and an electron transport layer sequentially formed on the anode.

8. The organic electronic element of claim 7, wherein the organic material layer further comprises a charge generation layer formed between the 2 or more stacks.

9. The organic electric element according to claim 3, wherein the organic electronic element is one of an OLED, an organic solar cell, an organic photo conductor (OPC), organic transistor (organic TFT) and an element for monochromic or white illumination.

* * * * *